US006954348B1

(12) United States Patent  (10) Patent No.: US 6,954,348 B1
Rodgers                    (45) Date of Patent:    Oct. 11, 2005

(54) TUNABLE MEMS CAPACITOR

(75) Inventor: M. Steven Rodgers, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 0 days.

(21) Appl. No.: 10/911,192

(22) Filed: Aug. 4, 2004

Related U.S. Application Data

(60) Provisional application No. 60/523,933, filed on Nov. 21, 2003.

(51) Int. Cl.⁷ .............................................. H01G 5/00
(52) U.S. Cl. ..................... 361/277; 361/361; 361/287; 361/278
(58) Field of Search ............................... 361/277, 278, 361/287, 299.1, 299.3, 299.4, 298.5

(56) References Cited

U.S. PATENT DOCUMENTS

| 5,696,662 | A | 12/1997 | Bauhahn | 361/298.1 |
|---|---|---|---|---|
| 5,959,516 | A | 9/1999 | Chang et al. | 334/14 |
| 6,122,964 | A | 9/2000 | Mohaupt et al. | 73/514.32 |
| 6,215,644 | B1 | 4/2001 | Dhuler | 361/280 |
| 6,355,534 | B1 | 3/2002 | Cheng et al. | 438/379 |
| 6,377,438 | B1 | 4/2002 | Deane et al. | 361/278 |
| 6,418,006 | B1 | 7/2002 | Liu et al. | 361/277 |
| 6,437,965 | B1 | 8/2002 | Adkins et al. | 361/303 |
| 6,490,147 | B2 | 12/2002 | Yoon et al. | 361/298.3 |
| 6,556,415 | B1 | 4/2003 | Lee et al. | 361/277 |
| 6,741,449 | B1 * | 5/2004 | Pasternak | 361/303 |

* cited by examiner

Primary Examiner—Anthony Dinkins
(74) Attorney, Agent, or Firm—Marsh Fischmann & Breyfogle LLP

(57) ABSTRACT

Various embodiments of tunable capacitors are disclosed. One embodiment is in the form of a tunable capacitor (368) having a pair of stationary capacitor electrodes (392) that are fixed to and disposed the same distance above a substrate (388) in the vertical dimension. A tuning element (416) is suspended above the substrate (388) by an elevation system (460) that accommodates movement of the tuning element (416) in the vertical dimension. Changing the capacitance of the tunable capacitor (368) is accomplished by moving the tuning element (416) in the vertical dimension.

31 Claims, 31 Drawing Sheets

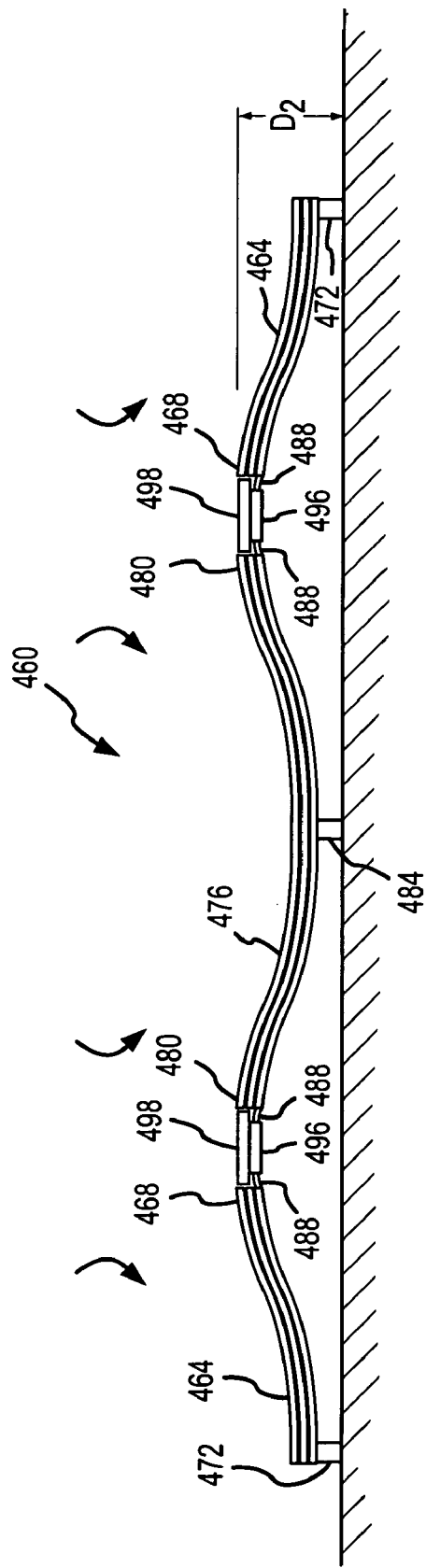

US 6,954,348 B1

TUNABLE MEMS CAPACITOR

CROSS REFERENCE TO RELATED APPLICATIONS

This patent application claims priority under 35 U.S.C. §119 to U.S. Provisional Patent Application Ser. No. 60/523,933, that is entitled "TUNABLE MEMS CAPACITOR," that was filed on Nov. 21, 2003, and the entire disclosure of which is incorporated by reference in its entirety herein.

FIELD OF THE INVENTION

The present invention generally relates to the field of tunable capacitors and, more particularly to a tunable capacitor that uses a pair of stationary, coplanar capacitor electrodes, as well as a tuning element that is movable (e.g., orthogonally) relative to these capacitor electrodes to vary the capacitance.

BACKGROUND OF THE INVENTION

One way to establish the capacitance of what is commonly referred to as a parallel plate capacitor is by changing the spacing between the capacitor plates or electrodes. There are capacitors of this type that may be tuned (to vary the capacitance) by changing the spacing between the capacitor electrodes. Known tunable configurations utilize a pair of capacitor electrodes, at least one of which is movable relative to the other to change the distance therebetween, and to thereby change the capacitance. Suspension springs may be used to movably interconnect any such capacitor electrode with a substrate to allow the particular capacitor electrode to be moved relative to the other capacitor electrode. In cases where the electrical signal to a capacitor electrode is directed through such a suspension spring, the quality of the capacitor is typically degraded or reduced because of the increased series resistance caused by the configuration of suspension spring.

Another known effect on the capacitance of a parallel plate capacitor is what, if anything, is disposed between the pair of capacitor electrodes. Changing what is disposed between the capacitor electrodes changes the capacitance of the capacitor. It is also known to have a pair of capacitor electrodes that are spaced in the vertical dimension, and to vary the capacitance by moving some type of structure in the horizontal dimension into the space between the vertically spaced capacitor electrodes. The amount that this structure is advanced within the space between the vertically spaced capacitor electrodes also has an effect on the capacitance of the tunable, parallel plate capacitor.

There are many applications that would benefit from the ability to fabricate tunable capacitors of a relatively small size. A number of microfabrication technologies have been explored for fabricating small structures in general (e.g., "microstructures", such as micromechanical devices or microelectromechanical devices) by what may be characterized as micromachining. Representative micromachining techniques include without limitation LIGA (Lithographie, Galvonoformung, Abformung), SLIGA (sacrificial LIGA), bulk micromachining, surface micromachining, micro electrodischarge machining (EDM), laser micromachining, and 3-D stereolithography. Bulk micromachining has been utilized for making relatively simple micromechanical structures. Bulk micromachining generally entails cutting or machining a bulk substrate using an appropriate etchant (e.g., using liquid crystal-plane selective etchants; using deep reactive ion etching techniques).

One micromachining technique that allows for the formation of significantly more complex microstructures is surface micromachining. Surface micromachining generally entails depositing alternate layers of structural material and sacrificial material using an appropriate substrate which functions as the foundation for the resulting microstructure. Various patterning operations may be executed on one or more of these layers before the next layer is deposited so as to define the desired microstructure. After the microstructure has been defined in this general manner, the various sacrificial layers are removed by exposing the microstructure and the various sacrificial layers to an appropriate etchant (e.g., one that is biased to the sacrificial layer(s)). This is commonly called "releasing" the microstructure from the substrate, typically to allow at least some degree of relative movement between the microstructure and the substrate.

BRIEF SUMMARY OF THE INVENTION

The present invention generally relates to tunable capacitors, including individual components thereof and methods of fabrication. Surface micromachining is preferably used in the fabrication of tunable capacitors associated with the present invention. However, other fabrication techniques may be appropriate, including without limitation any microfabrication technology. A microfabrication technology is one that allows realization of a feature size of about 10 microns or less.

A first aspect of the present invention is embodied by a tunable capacitor that includes a substrate, typically first and second capacitor plates or electrodes (only one may be required for a given application), and a tuning element. The first and second capacitor electrodes are each spaced above the substrate a first distance in a first dimension (e.g., a vertical dimension that is orthogonal to an upper surface the substrate), are each maintained in a stationary position relative to the substrate, and are spaced in a second dimension that is orthogonal to the first dimension (e.g., in a lateral or horizontal dimension; a dimension that is parallel with the upper surface of the substrate). The tuning element is disposed in a position in the second dimension that is between a position of the first capacitor electrode in the second dimension and a position of the second capacitor electrode in the second dimension, and further is movable in the first dimension.

Various refinements exist of the features noted in relation to the first aspect of the present invention. Further features may also be incorporated in the first aspect of the present invention as well. These refinements and additional features may exist individually or in any combination. First and second conductors may be disposed on and become part of the first and second capacitor electrodes, respectively. The first capacitor electrode and the first conductor may be formed from different materials, as may be the second capacitor electrode and second conductor. In one embodiment, the first and second capacitor electrodes are formed from a common material, and the first and second conductors are formed from another common material. For instance, the first and second capacitor electrodes may be polysilicon, and the first and second conductors may be metal (e.g., gold, copper). Utilizing a sufficiently electrically conductive material or combination of materials for the first and second capacitor electrodes may alleviate any need for the noted first and second conductors, and such is within the scope of this first aspect.

Electrical contact may be established with the above-noted first and second conductors (e.g., by bonding a first electrical lead directly to the first conductor and by bonding a separate second electrical lead directly to the second conductor). There is then no need for the electrical path to be through any of the support columns, posts, or anchors that may be used to dispose the first and second capacitor electrodes in a fixed, stationary position above the substrate in the first dimension. Disposing the first conductor on an upper surface of the first conductor electrode and disposing the second conductor on an upper surface of the second conductor electrode may facilitate this attachment of appropriate electrical leads, may in general facilitate making an electrical connection with the first and second conductors in a desired manner, and may provide other advantages (e.g., allowing the tunable capacitor to be fabricated by surface micromachining, specifically to allow the first and second conductors to be deposited after the various structural and sacrificial layers have been formed/patterned by surface micromachining).

The tunable capacitor of the first aspect may have a desirably high quality or Q/Q-factor, including when using a more resistive material for the first and second capacitor electrodes. In this regard, the resistance of the noted first and second conductors should be less than, and more preferably substantially less than, the resistance of the corresponding first and second capacitor electrodes in order to be able to achieve a desirably high quality for the tunable capacitor. Utilizing the first and second conductors thereby allows the first and second capacitor electrodes to be fabricated from a higher resistance material, such as polysilicon and which is commonly used in the fabrication of microstructures by surface micromachining, and yet still be able to realize a desirably high quality for the tunable capacitor of the first aspect.

The first and second capacitor electrodes each may also include a plurality of projections that are spaced along their adjacentmost edges or along those portions that "capacitively interact" with the tuning element. Generally, these projections function to increase the area between the tuning element and each of the first and second capacitor electrodes that capacitively interact, which thereby increases the capacitance between the tuning element and each of the first and second capacitor electrodes. These projections may be of any appropriate size, shape, or configuration, and further may be disposed in any appropriate orientation. In one embodiment, the projections are of uniform length and width, are uniformly spaced, and are disposed in parallel relation. In the case where the noted first and second conductors are used to lower the overall resistance of the first and second capacitor electrodes, it may be necessary or desirable for the first and second conductors to not extend over any of these projections (e.g., in order to allow the projections to retain a desired degree of structural integrity). However, having the first and second conductors extend partially or completely over the projections may be appropriate and/or acceptable in at least certain instances, and such is thereby within the scope of this first aspect.

A capacitive gap exists between each adjacent pair of projections on the first and second capacitor electrodes. The tuning element may include a plurality of projections along each of its sides or along those portions that "capacitively interact" with the first and second capacitor electrodes. These projections of the tuning element may be of any appropriate size, shape, or configuration, and further may be disposed in any appropriate orientation. In one embodiment, those projections of the tuning element that are associated with the first capacitor electrode are parallel, as are those projections of the tuning element that are associated with the second capacitor electrode. In any case, each projection of the tuning element is aligned in the first dimension with a space between a different adjacent pair of projections of either the first or second capacitor electrode. Changing the position of the tuning element in the first dimension changes the capacitance of the tunable capacitor. For instance, the tuning element may be moved in the first dimension to change the amount that the projections of the tuning element extend within the corresponding space between adjacent pairs of projections of either the first or second capacitor electrode. Changing the electrical bias on the first and second capacitor electrodes, changing the electrical bias on the tuning element, or both, may be used to change and thereafter maintain the position of the tuning element in the first dimension. It may be preferable to retain the orientation of the tuning element, regardless of its position in the first dimension. That is, it may be desirable for movement of the tuning element to be at least substantially in a single dimension while changing the capacitance (e.g., to maintain the tuning element in at least generally parallel relation with the substrate before, during and after being repositioned to vary capacitance).

A potential difference between the tuning element and each of the first and second capacitor electrodes is what determines the position of the tuning element in the case of the first aspect. One embodiment has the tuning element being "free floating" in the sense that it is not tied to an electrical potential at all. Another embodiment has the tuning element tied to an external reference. This external reference may be a ground (e.g., the substrate), may be a voltage source, or could be the first and/or second capacitor electrodes with at least one resistor being disposed between the tuning element and the first and second capacitor electrodes. In at least some cases, the tuning element should be tied to such an external reference through one or more high impedance components (e.g., resistors, inductors).

In one embodiment of the subject first aspect, the first and second capacitor electrodes of the tunable capacitor of the first aspect are fabricated from a common structural layer by surface micromachining (e.g., a structural layer that is disposed a common distance above a substrate). In another embodiment, both the first and second capacitor electrodes and the tuning element are fabricated from a common structural layer by surface micromachining. This reduces the potential for misalignment of the tuning element relative to the first and second capacitor electrodes by allowing a single mask to simultaneously define both the first and second capacitor electrodes, as well as the tuning element. One way that allows the tuning element and both the first and second capacitor electrodes to be fabricated from a common structural layer by surface micromachining is by utilizing an elevation system that biases the tuning element further away from the substrate after the tunable capacitor has been released at the end of the surface micromachining operation (e.g., after an etchant has been used to remove all or a portion of sacrificial material used in the fabrication of the tunable capacitor by surface micromachining).

The tunable capacitor of the first aspect may include a plurality of suspension springs that are attached to the tuning element. In one embodiment, these springs are in the form of an axially or linearly extending beam that extends in the lateral dimension. Any appropriate configuration may be used for the springs. In any case, these springs may be part of the type of above-noted elevation system. Multiple lifters may act on each such suspension spring to bias each such suspension spring away from the substrate (e.g., by disposing a pair of lifters in at least generally opposing relation). These suspension springs may interconnect with the tuning element by extending above or underneath the corresponding first or second capacitor electrode (e.g., at least one suspension spring may extend under the first capacitor electrode to interconnect with the tuning element, and at least one spring may extend under the second capacitor electrode to interconnect with the tuning element). Any appropriate way of interconnecting the suspension springs with the tuning element may be utilized and at any appropriate location. However, the suspension springs would typically be spaced from the substrate and the corresponding first or second capacitor electrode.

The above-noted lifters also may accommodate movement of the tuning element in the first dimension. Changing the bias on the first and second capacitor electrodes again may be used to change and thereafter maintain the position of the tuning element in the first dimension. Each such lifter may exert a biasing force on an associated suspension spring in a first direction, but yet still accommodate movement of these suspension springs in a second direction that is opposite the first direction. For instance, the lifters may be compliantly curved to a first extent when the tuning element is in a first position in the first dimension (e.g., corresponding with a zero bias condition or when no biasing signal is being provided to either the first capacitor electrode or the second capacitor electrode). The lifters may be compliantly curved to a second, lesser extent when the tuning element is in a second position in the first dimension that is lower than the first position (i.e., where the tuning element is closer to the substrate, but still preferably in spaced relation thereto). The change in curvature of the various lifters may be provided by their compliant constructions. Movement of the tuning element from the noted first position to the noted second position again may be provided by applying a certain electrical bias to both the first and second capacitor electrodes.

The above-noted lifters also may be used primarily to move the tuning element further away from the substrate after the tunable capacitor has been released at the end of the surface micromachining operation. Thereafter, the lifters may remain in at least somewhat of a fixed or stationary position. Repositioning the tuning element may be realized in this instance simply by a deflection or deformation of the above-noted suspension springs. It should be appreciated that the suspension springs could interconnect the tuning element with any appropriate structure, including a stationary structure that is anchored to the substrate. That is, the suspension springs may be used to allow the tuning element to move to change the capacitance of the tunable capacitor, whether an elevation system is used or not and regardless of whether the tuning element and the first and second capacitor electrodes are fabricated from a common structural layer by surface micromachining or if the tuning element is fabricated in a different structural layer from the first and second capacitor electrodes by surface micromachining.

The above-noted plurality of suspension springs may be disposed in any appropriate arrangement relative to the tuning element in the case of the first aspect (e.g., symmetrical arrangements, asymmetrical arrangements), although again such springs are preferably parallel with the substrate. Each suspension spring may be disposed perpendicular to a reference axis (e.g., along which the tuning element extends; that is perpendicular to the above-noted projections on opposing sides of the tuning element; that bisects the space in the lateral dimension between the projections of the first and second capacitor electrodes; that is parallel with the opposing edges of the first and second capacitor electrodes that is collectively defined by the ends of the above-noted projections). Each suspension spring may be disposed in parallel relation. It is also possible to dispose one suspension spring in one orientation in the second dimension, and to dispose another suspension in a different orientation in the second dimension. For instance, one or more suspension springs may be orthogonal to one or more other suspension springs. Consider the case where the tuning element includes first and second sides and first and second ends. The above-noted suspension springs may extend beyond both the first and second sides, with no suspension spring extending beyond either the first or second end. Increased stability of the tuning element may be achieved by having at least one suspension spring extend beyond both the first and second sides and beyond both the first and second ends of the tuning element.

A plurality of lifter assemblies may be interconnected with the tuning element used by the tunable capacitor of the first aspect. The term "interconnected", as used herein, includes being both directly attached, as well as where an intermediate structure is used. Each such lifter assembly may include a suspension spring and a lifter, with the tuning element being interconnected with the suspension spring in any appropriate manner, and with the lifter being interconnected with a suspension spring in any appropriate manner. Generally, the suspension spring and lifter may be disposed in a non-coaxial manner (e.g., oriented orthogonally to each other). Consider the case where the suspension spring extends in a first direction. The lifter may be characterized as having a length dimension that extends in a second direction that is orthogonal to the first direction. The lifter may curve along its length dimension to dispose the interconnected suspension spring above the substrate. Changing the curvature of the lifter may then be used to change the position of the interconnected suspension spring above the substrate in the first dimension. As noted above, this may be solely for increasing the spacing between the substrate and tuning element after the release, or to actually accommodate movement of the tuning element for controlling the capacitance during operation of the tunable capacitor.

A plurality of lifters may be appropriately interconnected with the tuning element to control its position in the first dimension relative to the substrate in the case of the first aspect. These lifters may be in the form of a pre-stressed beam that curves in the first dimension due to the stresses within the beam. Each pre-stressed beam may be anchored to the substrate at a location such that a first portion of the pre-stressed beam is able to move relative to the substrate. A suspension spring may be interconnected with the first portion of each such pre-stressed beam, as well as with the tuning element. For instance, one end of each such suspension spring may be interconnected with the first portion of one or more pre-stressed-beams, while its opposite end may be interconnected with the tuning element.

A plurality of the type of tunable capacitors associated with the first aspect may be disposed in the form of an array. This array may include at least two rows, with each row having at least one tunable capacitor therein. A given suspension spring may be interconnected with tuning elements in adjacent rows. All tunable capacitors in the array may respond the same to the electrical bias being applied to the first and second capacitor electrodes (e.g., the suspension springs associated with each tuning element may be of the same stiffness and the same capacitive gap(s) may be used between the projections of the various tuning elements and the corresponding projection of the first and second capacitor electrodes). At least one tuning element in the array may respond differently than at least one other tuning element in the array. The stiffness of the suspension springs, the size of the noted capacitive gap, or both may be different between at least two of the tuning elements in the array to vary their response, even though exposed to the same bias being applied to the first and second capacitor electrodes. One or more tuning elements in the array may be independently controllable, one or more tuning elements in the array may be structurally tied together so as to collectively move together, and thereby subject to a common control, or any combination thereof. All tuning elements in the array thereby may be independently controllable, one or more groups of multiple tuning elements in the array may be structurally tied together so as to be subject to a common control, or all tuning elements in the array may be structurally tied together so as to be subject to a common control.

The tuning element may be formed from any appropriate material or combination of materials in the case of the first aspect. For instance, the tuning element could have dielectric properties, conductive properties, or both. The tuning element also may be a unitary structure or formed from multiple layers of at least two different materials. For instance, the tuning element could include a metalization layer if desired/required. Any such layer could extend over the entire upper surface of the tuning element or only a portion of this surface (e.g., so as to not extend over the above-noted projections that may be used by the tuning element).

A second aspect of the present invention is embodied by a tunable capacitor that includes a substrate, typically first and second capacitor plates or electrodes (only one may be required for a given application), and a movable tuning element. The first and second capacitor electrodes each have a plurality of projections that are spaced along a side thereof that at least generally faces the other of the first and second capacitor electrodes. A capacitive gap exists between each adjacent pair of such projections on the first and second capacitor electrodes. The tuning element includes a plurality of projections along opposing sides. Each projection of the tuning element is aligned with a space between a different adjacent pair of projections on either the first capacitor electrode or the second capacitor electrode. Changing the position of the tuning element relative to the first and second capacitor electrodes changes the capacitance of the tunable capacitor. For instance, the tuning element may be moved to change the amount that the projections of the tuning element extend within the corresponding space between adjacent pairs of projections of the corresponding first or second capacitor electrode.

The various features discussed above in relation to the first aspect may be used in the above-noted second aspect, individually and in any combination.

A third aspect of the present invention is embodied by a tunable capacitor that includes a substrate, typically first and second capacitor plates or electrodes (only one may be required for a given application), and a movable tuning element. First and second conductors are disposed on the first and second capacitor electrodes, respectively. Changing the position of the tuning element relative to the first and second capacitor electrodes changes the capacitance of the tunable capacitor.

The various features discussed above in relation to the first aspect may be used in the above-noted third aspect, individually and in any combination.

A fourth aspect of the present invention is embodied by a tunable capacitor that includes a substrate, typically first and second capacitor plates or electrodes (only one may be required for a given application), and a movable tuning element. A plurality of suspension springs are interconnected with the tuning element. Multiple lifters collectively act on each such suspension spring to at least assist in controlling the position of the tuning element relative to the first and second capacitor electrodes.

The various features discussed above in relation to the first aspect may be used in the above-noted fourth aspect, individually and in any combination.

A fifth aspect of the present invention is embodied by a tunable capacitor that includes a substrate, typically first and second capacitor plates or electrodes (only one may be required for a given application), and a movable tuning element. First and second suspension springs are interconnected with the tuning element. The first and second suspension springs are disposed in different orientations, (for example, orthogonal to each other in the horizontal or lateral dimension). Consider the case where the tuning element includes first and second sides and first and second ends. At least one suspension spring may be associated with the first side, at least one suspension spring may be associated with the second side, at least one suspension spring may be associated with the first end, and at least one suspension spring may be associated with the second end. Each of these suspension springs may be axially extending and parallel with the substrate.

The various features discussed above in relation to the first aspect may be used in the above-noted fifth aspect, individually and in any combination.

A sixth aspect of the present invention is embodied by a tunable capacitor that includes a substrate, typically first and second capacitor plates or electrodes (only one may be required for a given application), and a movable tuning element. A plurality of lifters are interconnected with the tuning element and bias the tuning element away from the substrate. A travel limiter is associated with each such lifter to limit the maximum spacing between the tuning element and a substrate by constraining movement of the lifter beyond a certain distance above the substrate.

The various features discussed above in relation to the first aspect may be used in the above-noted sixth aspect, individually and in any combination.

A seventh aspect of the present invention is embodied by a tunable capacitor that includes a substrate, typically first and second capacitor plates or electrodes (only one may be required for a given application), and a movable tuning element. A plurality of lifter assemblies are interconnected with the tuning element. Each such lifter assembly includes a suspension spring and a lifter, with the tuning element being interconnected with the suspension spring in any appropriate manner, and with the lifter being interconnected with a suspension spring in any appropriate manner. Generally, the suspension spring and lifter are disposed in different orientations (for example, orthogonal). Consider the case where the suspension spring is an axial beam that extends in a first direction. The lifter may be characterized as having a length dimension that extends in a second direction that is orthogonal to the first direction. The lifter may curve along its length dimension to dispose the interconnected suspension spring above the substrate. Changing the curvature of the lifter may be used to change the position of the interconnected suspension spring beyond the substrate, and thereby the position of the tuning element relative to the substrate as well.

The various features discussed above in relation to the first aspect may be used in the above-noted seventh aspect, individually and in any combination.

An eighth aspect of the present invention is directed to a method for fabricating a tunable capacitor by surface micromachining. A plurality of layers are sequentially formed on a substrate to define a stack. Each layer is either of a structural material or a sacrificial material. One or more of these layers may be patterned. In any case, a first structural layer is patterned to define typically a pair of capacitor electrodes (only one may be required for a given application) and to define a tuning element that is located between the pair of capacitor electrodes. An upper surface of this first structural layer over the region having the pair of capacitor electrodes and the tuning element is thereby disposed at a common, constant distance from an upper surface of the substrate. The tunable capacitor is released by exposing the stack to one or more appropriate etchants to remove at least part of (and including all of) the sacrificial material from the stack.

Various refinements exist of the features noted in relation to the eighth aspect of the present invention. Further features may also be incorporated in the eighth aspect of the present invention as well. First and second conductors may be formed on the first and second capacitor electrodes after the stack has been defined, but before the tunable capacitor is released. In one embodiment, each of the tuning element and the first and second electrodes are polysilicon, while the first and second conductors are metal (e.g., gold).

A ninth aspect of the present invention is embodied by what may be characterized as an array of a plurality of tunable capacitors. Each tunable capacitor includes typically first and second capacitor plates or electrodes (only one may be required for a given application), as well as a corresponding movable tuning element. The array includes a plurality of rows, with each row having at least one tunable capacitor.

The various features discussed above in relation to the first aspect may be used in the above-noted ninth aspect, individually and in any combination.

A tenth aspect of the present invention is embodied by what may be characterized as a tunable capacitor array. This array includes a plurality of rows, with each row having at least one movable tuning element and typically first and second capacitor electrodes (only one may be required for a given application).

Various refinements exist of the features noted in relation to the tenth aspect of the present invention. Further features may also be incorporated in the tenth aspect of the present invention as well. The various features discussed above in relation to the first aspect may be used in the above-noted tenth aspect, individually and in any combination. Moreover, any lifter used by the tunable capacitor array may act on multiple suspension springs, for instance a first lifter may act on a first suspension spring associated with a first tuning element in one row, and may further act on a second suspension spring associated with a second tuning element in a different row.

Any appropriate number of rows may be utilized by the tunable capacitor array of the subject tenth aspect. Multiple tuning elements may be included in any row of the tunable capacitor array, including having multiple tuning elements in each row. Tuning elements in any row of the array may be independently movable. At least two tuning elements in the array may respond differently to the same electrical bias (e.g., by using suspension springs having different stiffnesses). Two or more tuning elements in any row of the array may be structurally interconnected so as to collectively move together. All tuning elements in the array may be structurally interconnected so as to collectively move together.

The tunable capacitor array in the case of the tenth aspect may include a single first and second capacitor electrode, with the first capacitor electrode extending along a first side of the array and including a plurality of parallel first sections that extend toward a second side that is opposite the first side, and with the second capacitor electrode extending along the second side and including a plurality of second sections that extend toward the first side. A row having at least one tuning element is then disposed between a corresponding pair of first and second sections of the first and second capacitor electrodes, respectively.

In one embodiment of the tenth aspect, each row having at least one tuning element may be characterized as having a first side and a second side along the length dimension thereof. In this case, the first sections of the first capacitor electrode may be arranged such that adjacent first sections are disposed on opposite sides of the tuning element(s) in their respective rows. Similarly, the second sections of the second capacitor electrode may be arranged such that adjacent second sections are disposed on opposite sides of the tuning element(s) in their respective rows. In another embodiment, at least some of the first sections of the first capacitor electrode and at least some of the second sections of the second capacitor electrode capacitively interact with tuning elements disposed in adjacent rows.

An eleventh aspect of the present invention is embodied by a tunable capacitor that includes a substrate, first and second capacitor plates or electrodes (only one may be required for a given application), and a movable tuning element. The tuning element is movable about an axis to change the capacitance of the tunable capacitor.

BRIEF DESCRIPTION OF THE SEVERAL
VIEWS OF THE DRAWING

FIG. 11E is a side view of the elevation system of FIGS. 10A–C when disposing the tuning element in the position of FIG. 11D.

Figure 7A:
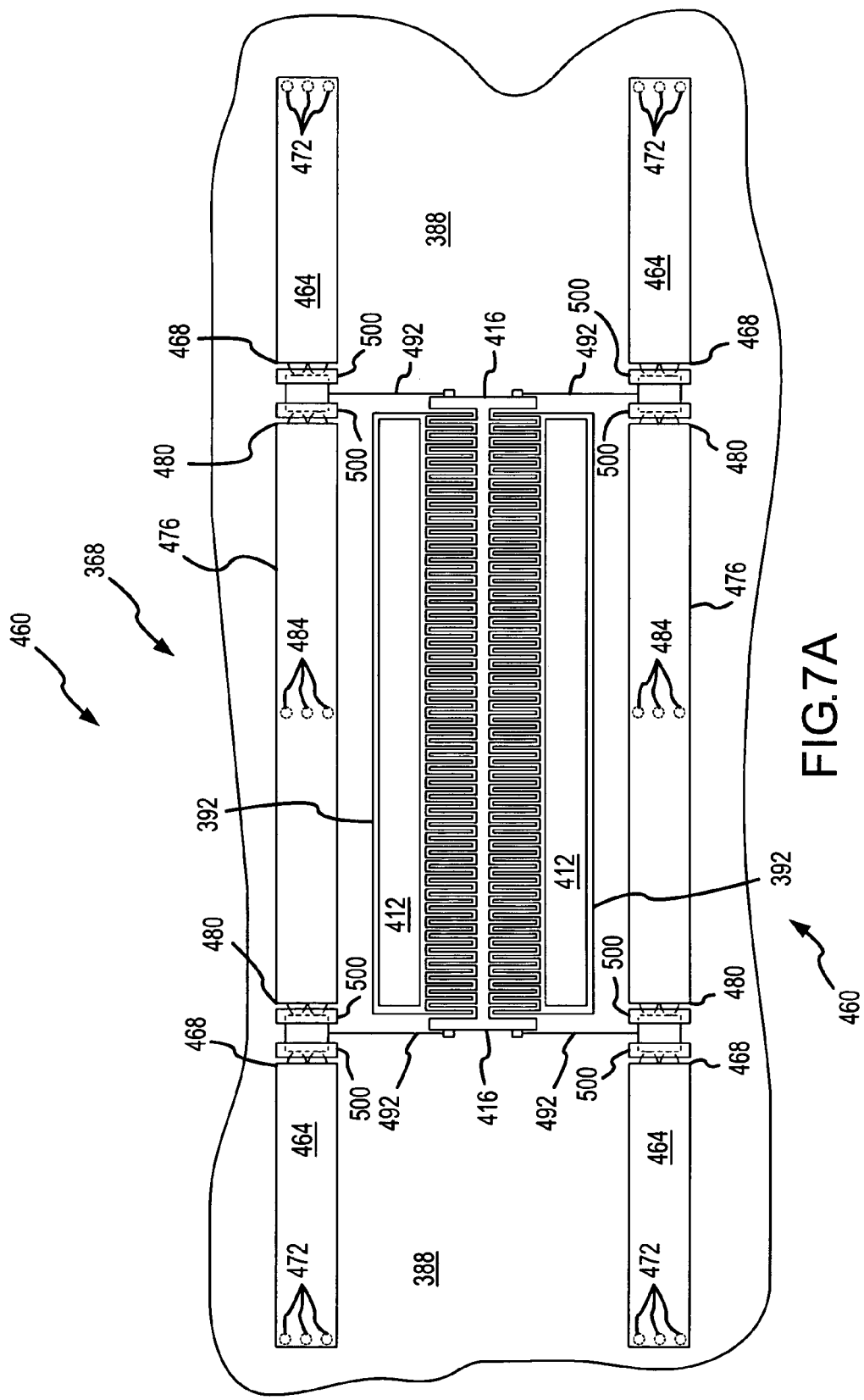
FIG. 7A is a top, plan view of one embodiment of a tunable capacitor generally of the type illustrated in FIGS. 3A–3B.
Figure 7B:
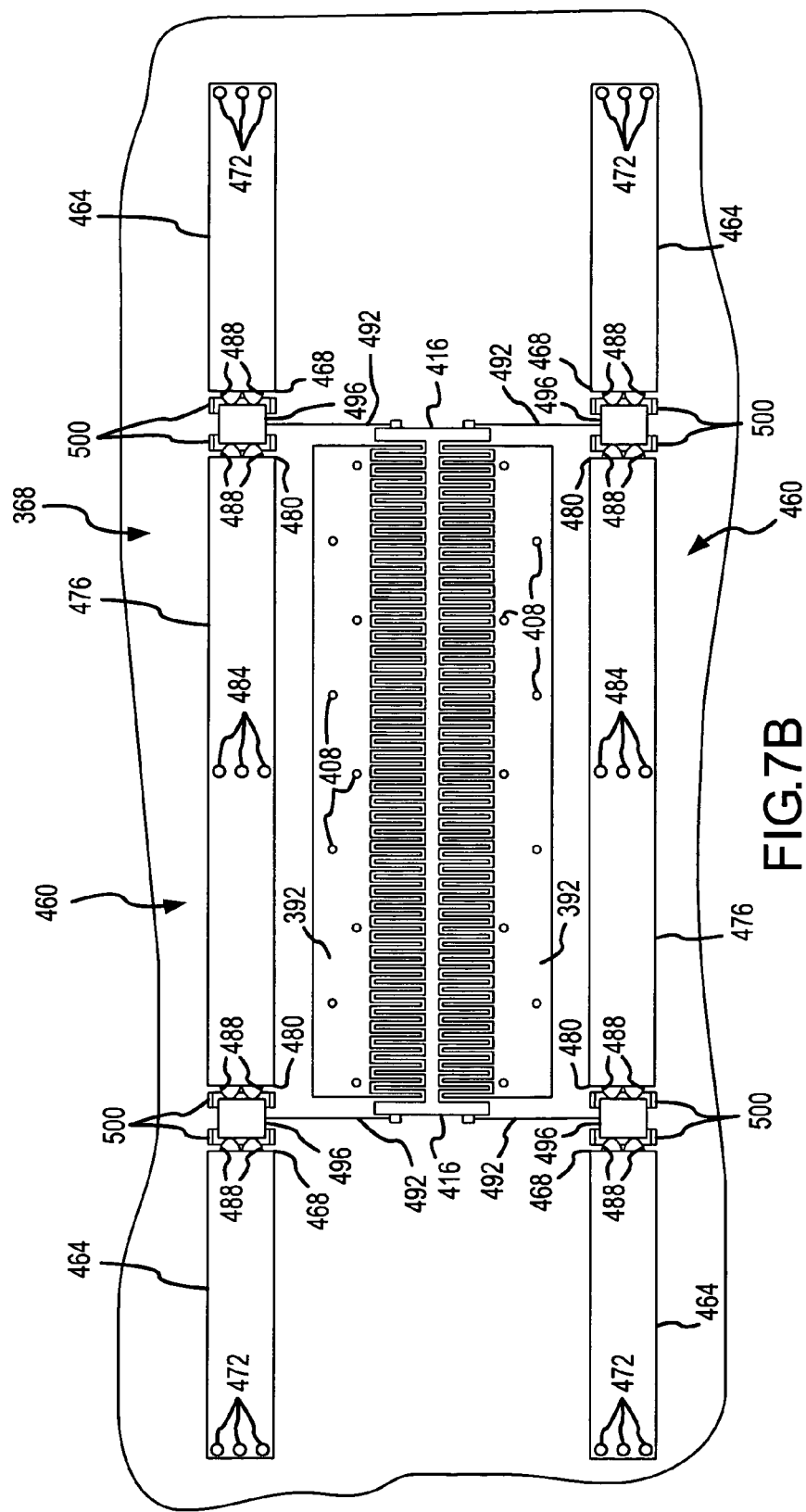
FIG. 7B is a bottom, plan of the tunable capacitor of FIG. 7A.

FIGS. 12A–M illustrate one way of fabricating the capacitor electrodes and tuning element of the tunable capacitor of FIGS. 7A–B by surface micromachining.

Figure 13A:
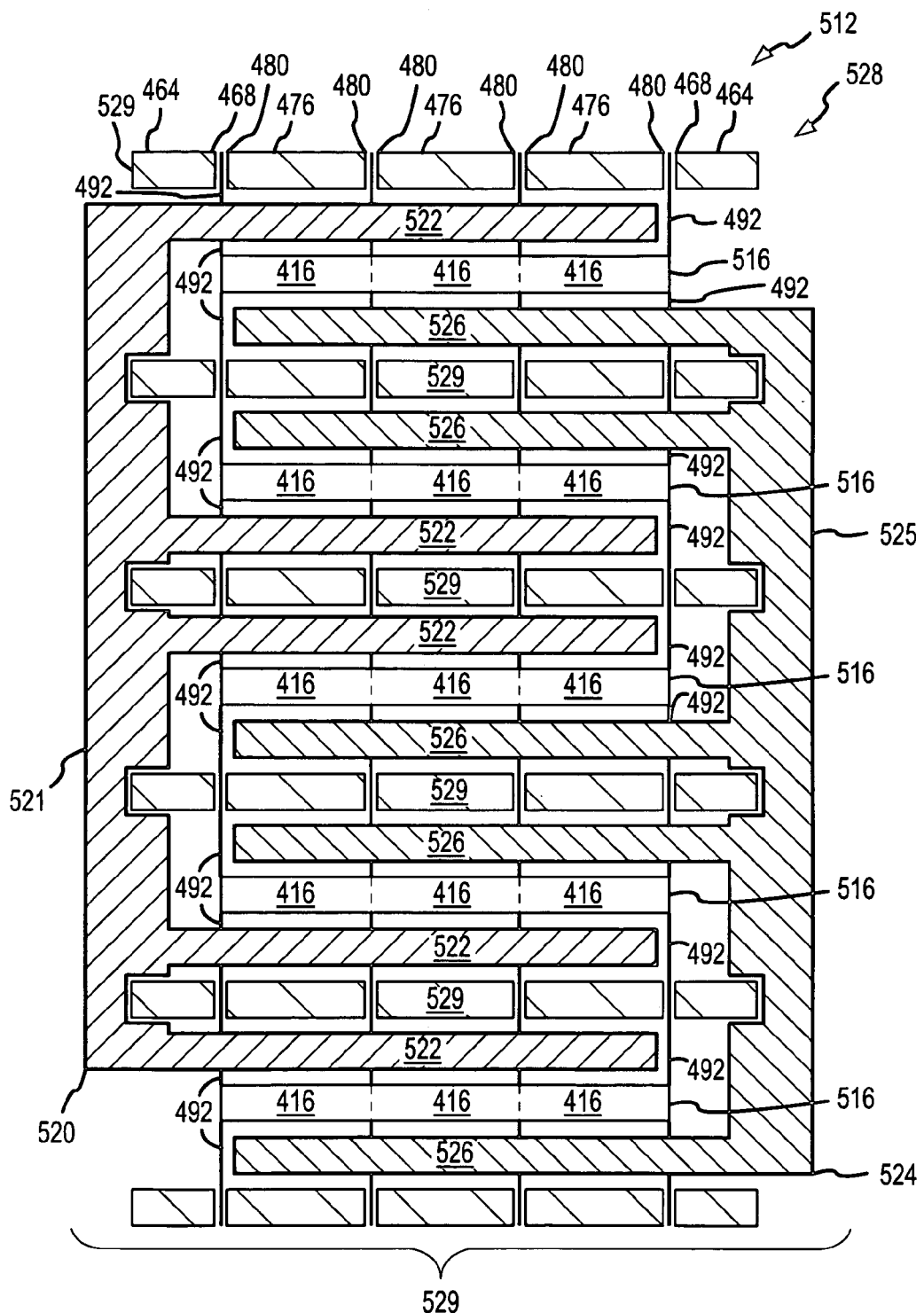

FIG. 13A is a top view one embodiment of a tunable capacitor array.

Figure 13B:
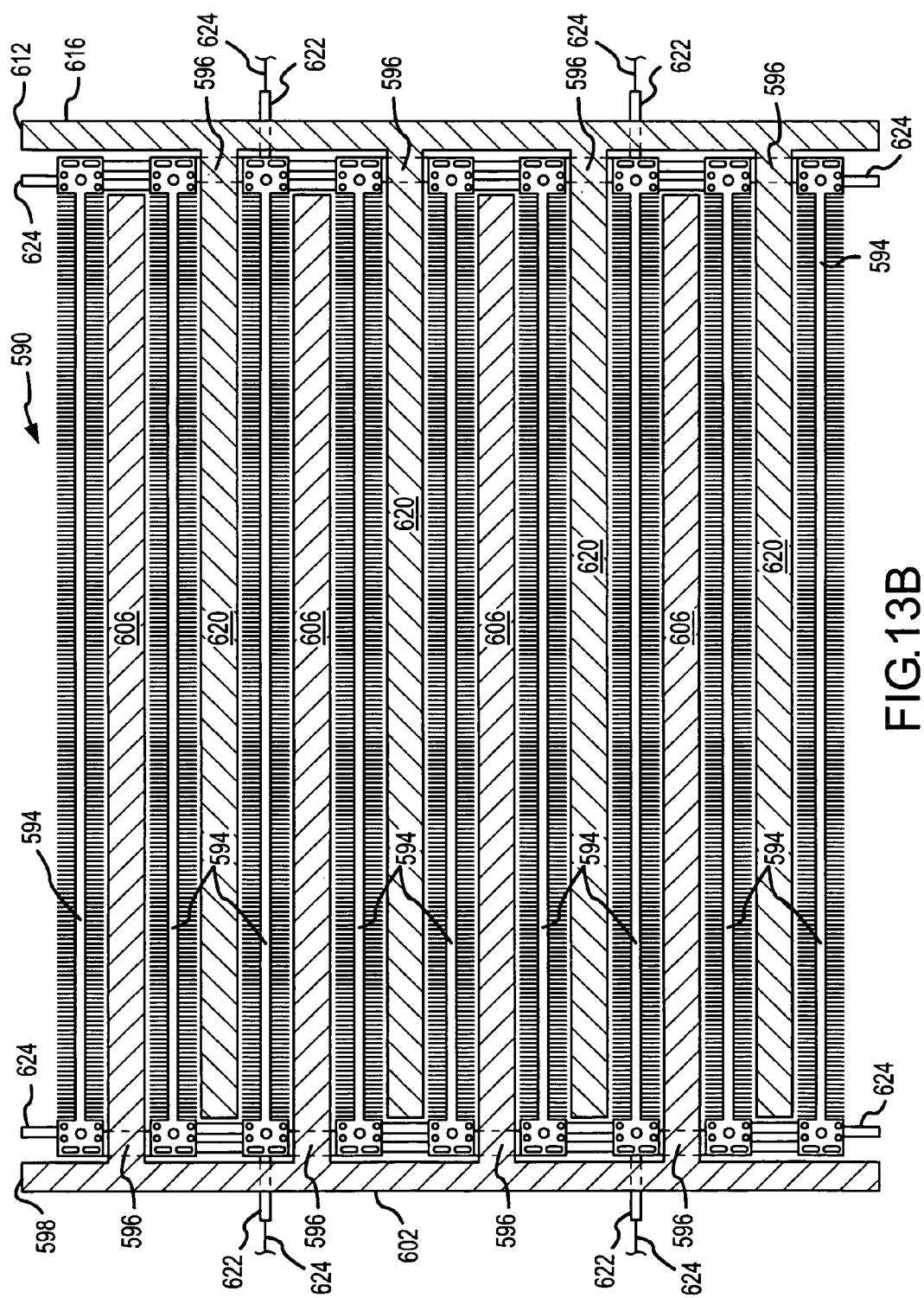

FIG. 13B is a top view another embodiment of a tunable capacitor array.

Figure 13C:
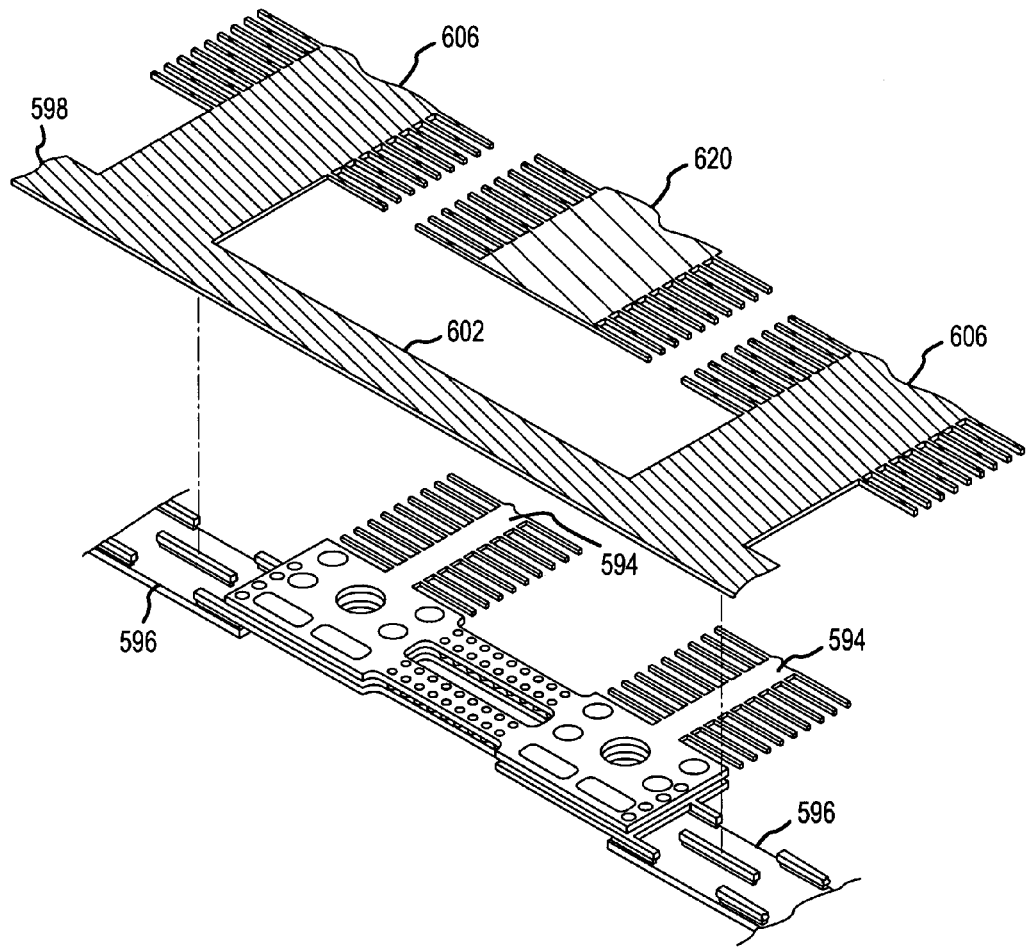

FIG. 13C is a perspective view of the structural interconnection of adjacent tuning elements in the tunable capacitor array of FIG. 13B.

Figure 14A:
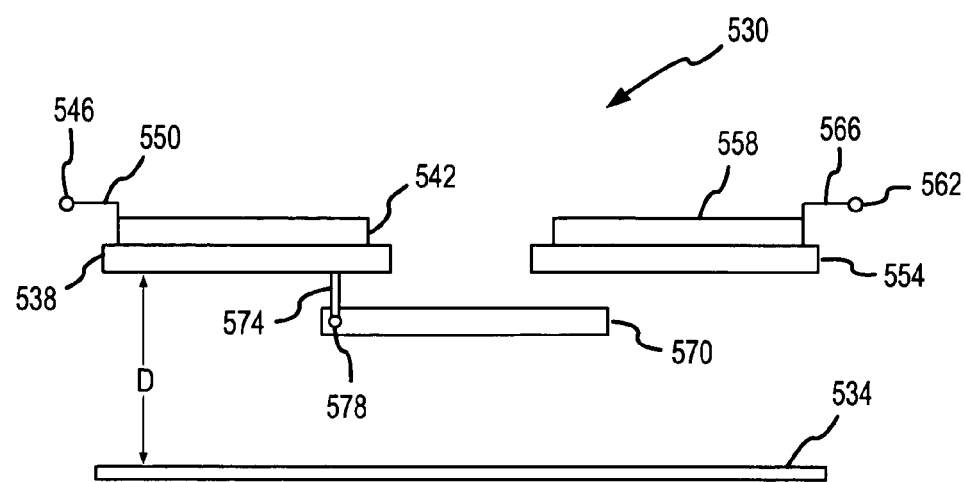

FIG. 14A is a schematic of another embodiment of a tunable capacitor having a pair of coplanar, stationary capacitor electrodes each having a conductor disposed thereon, as well as a tuning element in a first position and that is movable about an axis to vary the capacitance.

Figure 14B:
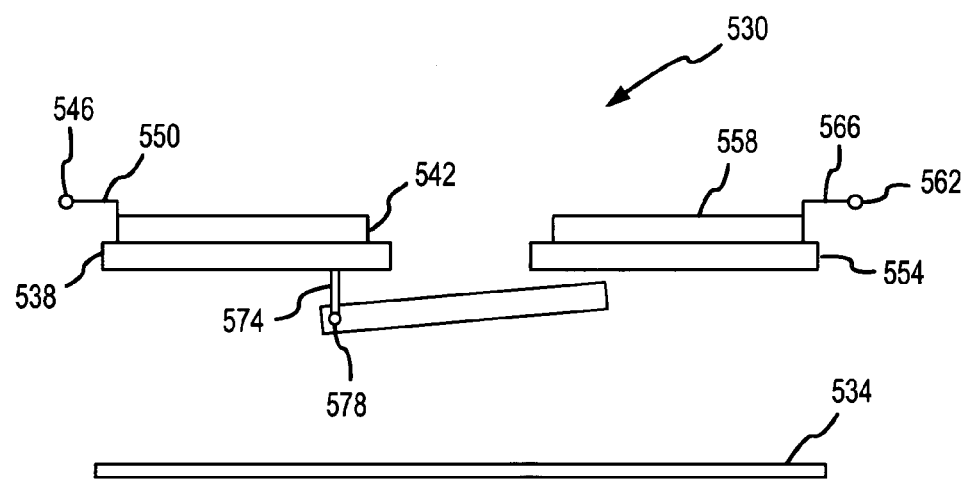

FIG. 14B is the tunable capacitor of FIG. 14A, with the tuning element being disposed in a second position by having moved about the axis.

DETAILED DESCRIPTION OF THE INVENTION

The present invention will now be described in relation to the accompanying drawings which at least assist in illustrating its various pertinent features. Various embodiments of tunable capacitors will be described herein. Each of these tunable capacitors may be fabricated by one or more appropriate microfabrication technologies, such as micromachining. Surface micromachining is the currently preferred fabrication technique for each of these tunable capacitors.

Figure 1:
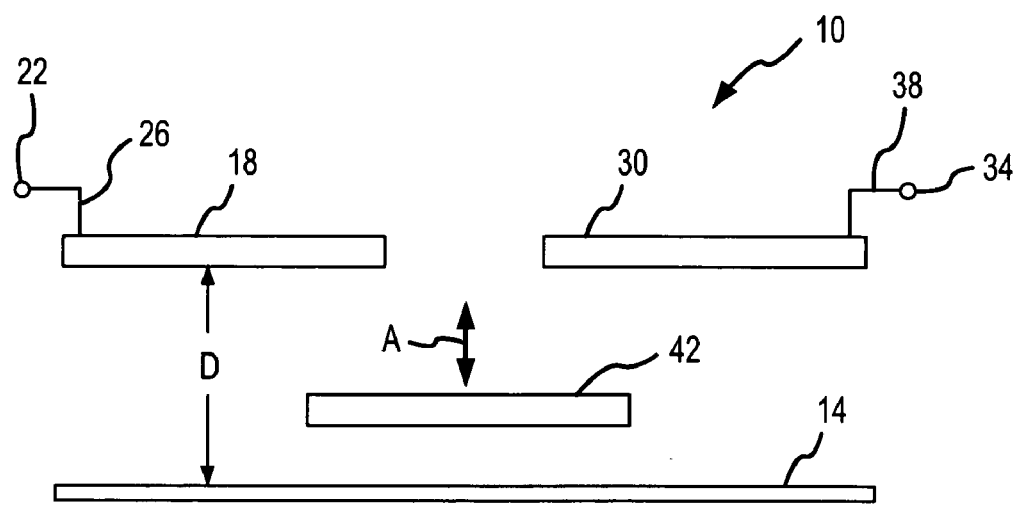
FIG. 1 is a schematic of one embodiment of a tunable capacitor having a pair of coplanar, stationary capacitor electrodes, as well as a tuning element that is movable in a first dimension to vary the capacitance.

One embodiment of a tunable capacitor is illustrated in FIG. 1 and is identified by reference numeral 10. The tunable capacitor 10 is fabricated on/from a substrate 14 that is suitable for surface micromachining and that is the ultimate supporting structure of the resulting tunable capacitor 10. Fundamental components of the tunable capacitor 10 include a first capacitor electrode 18, a second capacitor electrode 30, and a tuning element 42. The first capacitor electrode 18, the second capacitor electrode 30, and tuning element 42 each may be of any appropriate configuration and formed from any appropriate material or combination of materials.

The first capacitor electrode 18 and the second capacitor electrode 30 are appropriately supported above the substrate 14 in a fixed/stationary position. A first electrical terminal 22 is electrically interconnected with the first capacitor electrode 18 by a first electrical lead 26. Similarly, a second electrical terminal 34 is electrically interconnected with the second capacitor electrode 30 by a second electrical lead 38. The electrical terminals 22, 34 are associated with a source for applying an electrical bias between the movable tuning element 42 of the tunable capacitor 10 and each of the first capacitor electrode 18 and the second capacitor electrode 30 (e.g., a voltage source).

The first capacitor electrode 18 and the second capacitor electrode 30 may be characterized as being coplanar. Stated another way, the first capacitor electrode 18 and the second capacitor electrode 30 are disposed a common distance above the substrate 10 in a first or vertical dimension (orthogonal to the substrate 14, and illustrated by the dimension "D" in FIG. 1). As will be discussed in more detail below, this is particularly advantageous for fabricating the tunable capacitor 10 by surface micromachining. The first capacitor electrode 18 and the second capacitor electrode 30 are also spaced in a second or lateral or horizontal dimension that is orthogonal to the vertical dimension (e.g., parallel with the substrate 14). As used herein, the "vertical dimension" is that which is at least generally orthogonal to the substrate, regardless of the orientation of the tunable capacitor during operation.

The tuning element 42 is vertically spaced from and parallel with each of the first capacitor electrode 18 and the second capacitor electrode 30. In the illustrated embodiment, the tuning element 42 is larger in the lateral dimension than the lateral spacing between the first capacitor electrode 18 and the second capacitor electrode 30. As such, a portion of each of the first capacitor electrode 18 and the second capacitor electrode 30 is disposed directly above a portion of the tuning element 42 (i.e., a first portion of the tuning element 42 is vertically aligned with a portion of the first capacitor electrode 18, while a second portion of the tuning element 42 is vertically aligned with a portion of the second capacitor electrode 30).

The tuning element 42 is movable in the vertical dimension to increase or decrease that vertical spacing between the tuning element 42 and each of the first capacitor electrode 18 and the second capacitor electrode 30, as represented by the double-headed arrow "A" in FIG. 1. Preferably, the orientation of the tuning element 42 is maintained during movement in the vertical dimension (e.g., no movement of the tuning element 42 in the horizontal dimension, and the tuning element 42 remains parallel with the substrate 14). Movement of the tuning element 42 in the vertical dimension is in response to a change in the electrical bias of the first and second capacitor electrodes 18, 30 via the first and second electrical terminals 22, 34. Changing the vertical spacing between the tuning element 42 and each of the first capacitor electrode 18 and the second capacitor electrode 30 changes the capacitance of the tunable capacitor 10. Various ways of movably interconnecting the tuning element 42 with the substrate 14 will be discussed in more detail below.

Figure 2:
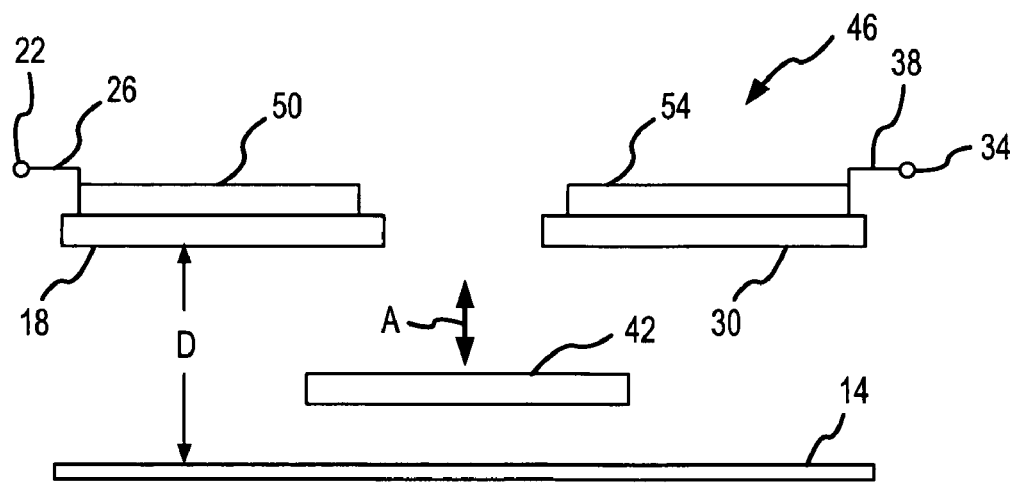
FIG. 2 is a schematic of another embodiment of a tunable capacitor having a pair of coplanar, stationary capacitor electrodes each having a separate conductive element disposed thereon, as well as a tuning element that is movable in a first dimension to vary the capacitance.

An adaptation of the tunable capacitor 10 of FIG. 1 that may increase the quality or Q/Q-factor is illustrated in FIG. 2 and is identified by reference numeral 46. Common components of the tunable capacitor 46 of FIG. 2 and the tunable capacitor 10 of FIG. 1 are identified by the same reference numeral, and the various features/characteristics thereof will not be repeated. The primary difference between the tunable capacitor 46 of FIG. 2 and the tunable capacitor 10 of FIG. 1 is the manner of applying an electrical signal to the each of the first capacitor electrode 18 and the second capacitor electrode 30. Specifically, the tunable capacitor 46 includes a first conductor 50 that is disposed on an upper surface of the first capacitor electrode 18 and that interfaces with the first electrical lead 26. Similarly, the tunable capacitor 46 includes a second conductor 54 that is disposed on an upper surface of the second capacitor electrode 30 and that interfaces with the second electrical lead 38. The electrical resistance of the first conductor 50 is preferably substantially less than the electrical resistance of the first capacitor electrode 18, and the electrical resistance of the second conductor 54 is preferably substantially less than the electrical resistance of the second capacitor electrode 30. In one embodiment, the first capacitor electrode 18 and the second capacitor electrode 30 are polysilicon, and the first conductor 50 and second conductor 54 are an appropriate metal such as gold. This configuration provides a tunable capacitor 46 with a high Q or Q-factor (high quality) that may be fabricated by surface micromachining. It should be appreciated that the first conductor 50 and first capacitor electrode 18 collectively function as one capacitor electrode, and that the second conductor 54 and the second capacitor electrode 30 collectively function as the other capacitor electrode.

Figure 3A:
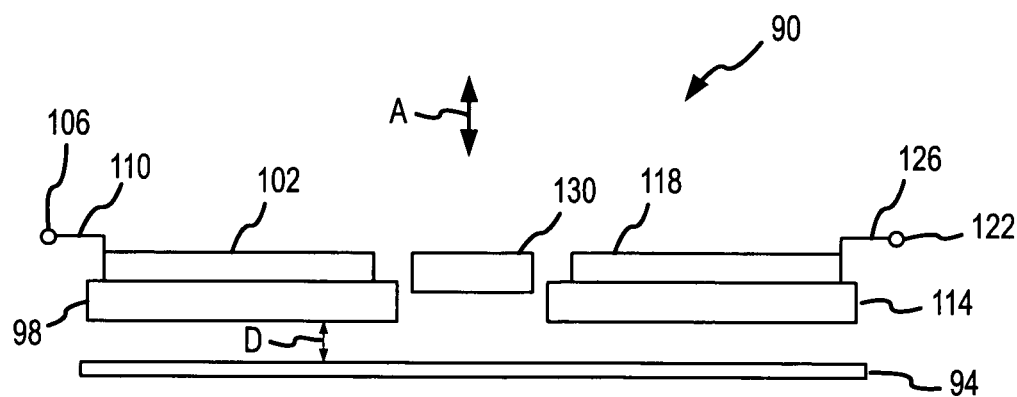
FIG. 3A is a schematic of another embodiment of a tunable capacitor having a pair of coplanar, stationary capacitor electrodes each having a separate conductive element disposed thereon, as well as a tuning element in a first position and that is movable in a first dimension within a space between the capacitor electrodes to vary the capacitance.
Figure 3B:
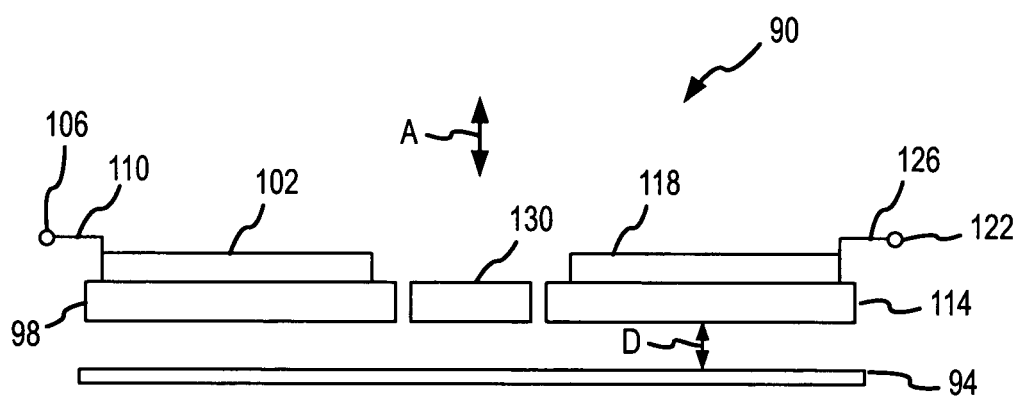
FIG. 3B is the tunable capacitor of FIG. 3A, with the tuning element being disposed in a second position between the pair of stationary capacitor electrodes.

Another embodiment of a tunable capacitor is illustrated in FIGS. 3A–B and is identified by reference numeral 90. The tunable capacitor 90 is fabricated on/from a substrate 94 that is suitable for surface micromachining and that is the ultimate supporting structure of the resulting tunable capacitor 90. Fundamental components of the tunable capacitor 90 include a first capacitor electrode 98, a second capacitor electrode 114, and a tuning element 130. The first capacitor electrode 98, the second capacitor electrode 114, and tuning element 130 each may be of any appropriate configuration and formed from any appropriate material or combination of materials.

The first capacitor electrode 98 and the second capacitor electrode 114 are appropriately supported above the substrate 94 in a fixed/stationary position. A first conductor 102 is disposed on an upper surface of the first capacitor electrode 98 and becomes part thereof, while a second conductor 118 is disposed on an upper surface of the second capacitor electrode 114 and becomes part thereof. The electrical resistance of the first conductor 102 is preferably substantially less than the electrical resistance of the first capacitor electrode 98, and the electrical resistance of the second conductor 118 is preferably substantially less than the electrical resistance of the second capacitor electrode 114. In one embodiment, the first capacitor electrode 98 and the second capacitor electrode 114 are polysilicon, and the first conductor 102 and second conductor 118 are an appropriate metal such as gold. This configuration provides a tunable capacitor 90 with a high Q or Q-factor (high quality) that may be fabricated by surface micromachining.

A first electrical terminal 106 is electrically interconnected with the first conductor 102 by a first electrical lead 110. Similarly, a second electrical terminal 122 is electrically interconnected with the second conductor 118 by a second electrical lead 126. The electrical terminals 106, 122 are associated with a source for applying an electrical bias between the movable tuning element 130 of the tunable capacitor 90 and each of the first capacitor electrode 98 and the second capacitor electrode 114 (e.g., a voltage source).

The first capacitor electrode 98 and the second capacitor electrode 114 may be characterized as being coplanar. Stated another way, the first capacitor electrode 98 and the second capacitor electrode 114 are disposed above the substrate 94 in the vertical dimension (orthogonal to the substrate 94 and represented by dimension "D" in FIGS. 3A–B). As will be discussed in more detail below, this is particularly advantageous for fabricating the tunable capacitor 90 by surface micromachining. The first capacitor electrode 98 and the second capacitor electrode 114 are also spaced in a lateral or horizontal dimension that is orthogonal to the vertical dimension (parallel with the substrate 94).

The tuning element 130 is movable in the vertical dimension into and out of the lateral space between the first capacitor electrode 98 and the second capacitor electrode 114, as represented by the double-headed arrow "A" in FIGS. 3A–B. Preferably, the orientation of the tuning element 130 is maintained during this movement in the vertical dimension (e.g., no substantial movement of the tuning element 130 in the horizontal dimension, and the tuning element 130 remains parallel with the substrate 94). Movement of the tuning element 130 is in response a change in the electrical bias of the first and second capacitor electrodes 98, 114 via the first and second electrical terminals 106, 122. Various ways of movably interconnecting the tuning element 130 with the substrate 94 will be discussed in more detail below.

The lateral extent of the space between the first capacitor electrode 98 and the second capacitor electrode 114 accommodates movement of the tuning element 130 from the position illustrated in FIG. 3A (e.g., a zero bias position, and minimum capacitance) to the position illustrated in FIG. 3B (e.g., a maximum capacitance position), while still maintaining an appropriate capacitive gap between the tuning element 130 and each of the first capacitor electrode 98 and the second capacitor electrode 114. Changing the amount that the tuning element 130 extends vertically within the lateral space between the first capacitor electrode 98 and the second capacitor electrode 114 changes the capacitance of the tunable capacitor 90.

The configuration utilized by the tunable capacitor 90 provides further advantages for fabricating the tunable capacitor 90 by surface micromachining, and that will be discussed in more detail below. Generally, the first capacitor electrode 98, the second capacitor electrode 114, and the tuning element 130 may be fabricated in the same structural level of a stack of a plurality of layers used in surface micromachining (e.g., in the same layer of polysilicon). This is advantageous in that a single photolithographic mask may be used to simultaneously define the first capacitor electrode 98, the second capacitor electrode 114, and the tuning element 130.

Fabricating the tuning element 130 in a different structural level of such a stack than the first capacitor electrode 98 and the second capacitor electrode 114 would require one photolithographic mask to define the tuning element 130, and a different photolithographic mask would be required to define both the first capacitor electrode 98 and the second capacitor electrode 114. Misalignment of these two masks during fabrication may adversely affect the tunable capacitor 90 in one or more respects. However, a certain amount of misalignment may be acceptable in at least certain instances. Therefore, the tuning element 130 could in fact be fabricated in a different structural level than the first capacitor electrode 98 and the second capacitor electrode 114.

Figure 4A:
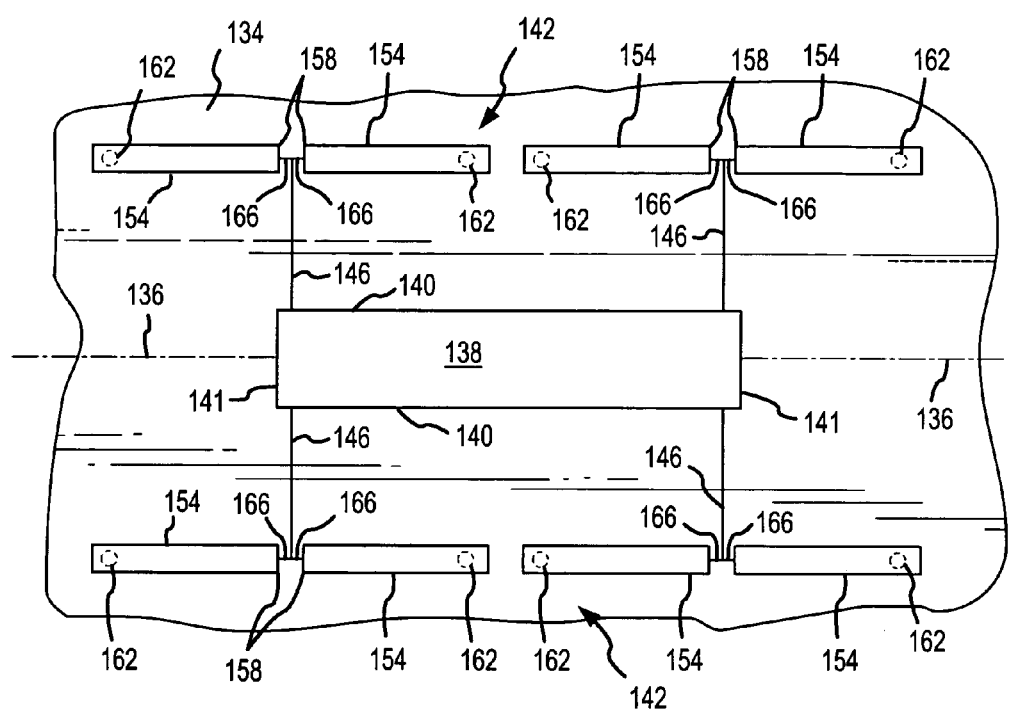
FIG. 4A is a top, plan view of one embodiment of an elevation system for a tuning element of a tunable capacitor to allow the tuning element to move in a first dimension.

The tuning elements of the tunable capacitors described herein may be suspended above the substrate by one or more springs that allow the tuning element to move in the vertical dimension in response to a change in the electrical bias of the first and second capacitor electrodes. This change in position again provides a change in capacitance. One arrangement of a plurality of suspension springs to allow for the noted movement of the tuning element is illustrated in FIG. 4A. A tuning element 138 is suspended above a substrate 134 by an elevation system 142 in the FIG. 4A embodiment. Components of the elevation system 142 include a plurality of pliable, axially extending suspension springs 146 (e.g., bendable at least in the vertical dimension) and a plurality of lifters 154. The suspension springs 146 will typically be disposed parallel with the substrate 134, although other orientations may be appropriate.

Each lifter 154 includes a free end or portion 158 that is able to move away from or toward the substrate 134, as well as an anchor 162 that fixes a portion of the lifter 154 to the substrate 134. A flexible connector 166 provides an appropriate interface between the lifter 154 and its corresponding suspension spring 146.

Two lifters 154 engage each suspension spring 146 in the FIG. 4A embodiment, and these lifters 154 are disposed in what may be characterized as opposing relation in the illustrated embodiment. Each suspension spring 146 extends from one of the two sides 140 of the tuning element 138. No suspension spring 146 extends from either of the two ends 141 of the tuning element 138 (note the embodiment of FIG. 4B, however). Any number of suspension springs 146 could extend from each side 140 of the tuning element 138. Arranging the suspension springs 146 on one side 140 of the tuning element 138 as the mirror image of the suspension springs 146 on the opposite side 140 of the tuning element 138 at least substantially maintains the parallel relationship of the tuning element 138 to the substrate 134, while allowing for a change in vertical position of the tuning element 138 (e.g., before, during, and after movement of the tuning element 138 in the vertical dimension). In the illustrated embodiment, each suspension spring 146 is disposed perpendicularly to a reference axis 136 (e.g., along which the tuning element 138 extends), and each suspension spring 146 on one side 140 of the tuning element 130 is co-linear (disposed in direct, opposing relation) with a suspension spring 146 on the opposite side 140 of the tuning element 130. Other arrangements may be appropriate. Both a symmetrical arrangement and an asymmetrical arrangement of suspension springs 146 may be appropriate or at least acceptable for one or more applications.

Figure 4B:
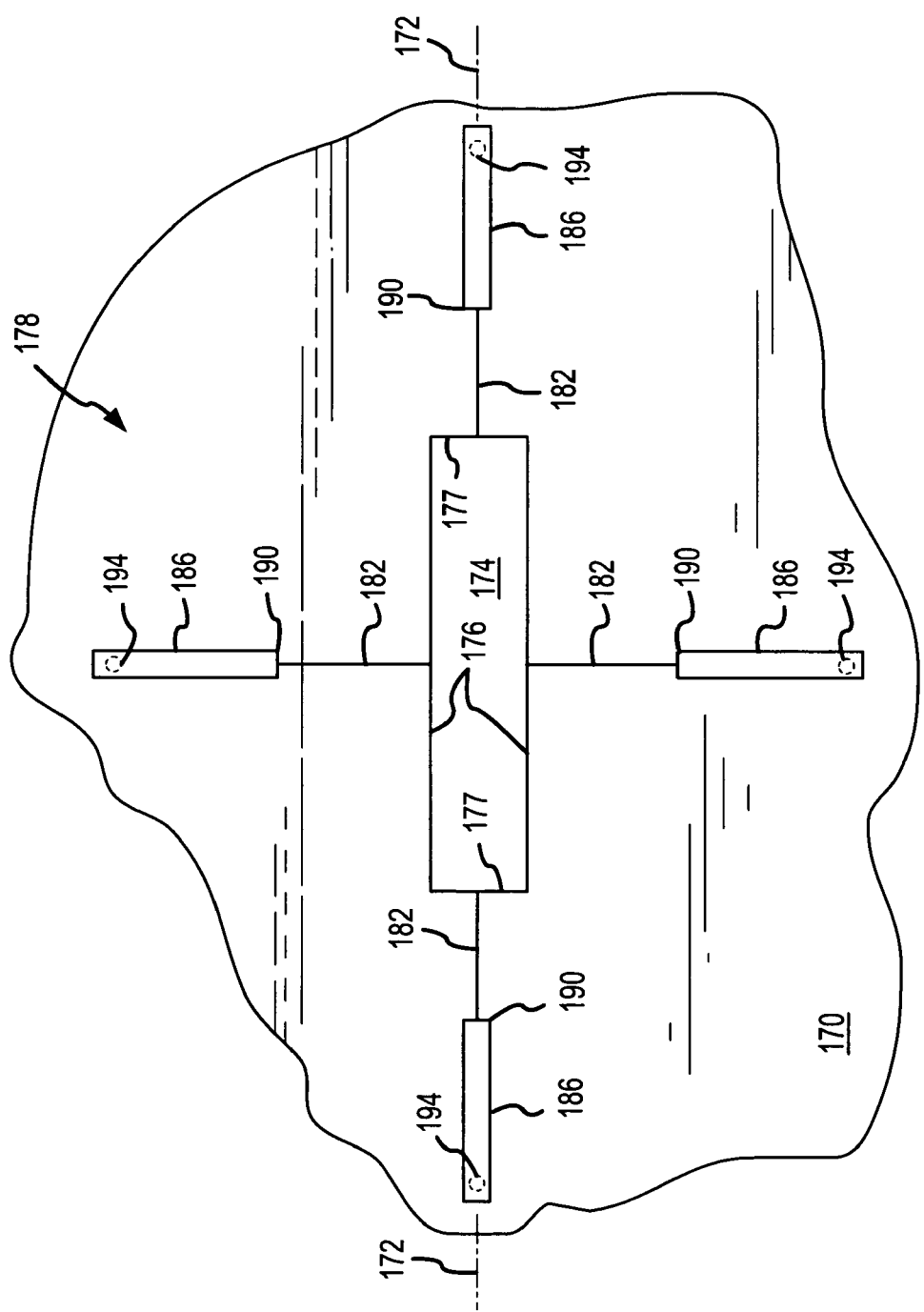
FIG. 4B is a top, plan view of another embodiment of an elevation system for a tuning element of a tunable capacitor to allow the tuning element to move in a first dimension.

Another arrangement of a plurality of suspension springs to allow for the noted movement of the tuning element is illustrated in FIG. 4B. A tuning element 174 is suspended above a substrate 170 by an elevation system 178 in the FIG. 4B embodiment. Components of the elevation system 178 include a plurality of pliable, axially extending suspension springs 182 (e.g., bendable at least in the vertical dimension) and a plurality of lifters 186. The suspension springs 182 will typically be disposed parallel with the substrate 134. Each lifter 186 includes a free end or portion 190 that is able to move away from or toward the substrate 170, as well as an anchor 194 that fixes a portion of the lifter 186 to the substrate 170.

One lifter 186 engages each suspension spring 182 in the FIG. 4B embodiment. A suspension spring 182 extends from each of the two ends 177 of the tuning element 174 and from each of the two sides 176 of the tuning element 174. Multiple suspension springs 182 could extend from each end 177, from each side 176 of the tuning element 174, or both. Arranging the suspension springs 182 on one side 176 of the tuning element 174 as the mirror image of the suspension springs 182 on the opposite side 176 of the tuning element 174, and arranging the suspension springs 182 on one end 177 of the tuning element 174 as the mirror image of the suspension springs 182 on the opposite end 177 of the tuning element 174, at least substantially maintains the parallel relationship of the tuning element 174 to the substrate 170 while allowing for a change in vertical position of the tuning element 174 (e.g., before, during, and after movement of the tuning element 174 in the vertical dimension). Having at least one suspension spring 182 on each end 177 of the tuning element 174, as well as on each side 176 of the tuning element 174, increases the stiffness of the interconnection of the tuning element 174 to the substrate 170 along a reference axis 172 (e.g., along which the tuning element 174 extends). Stated another way, the arrangement of the suspension springs 182 is such that only the vertical position of the tuning element 174 above the substrate 170 changes by the action of the suspension springs 182 on the tuning element 174, and not the orientation of the tuning element 174 in the lateral dimension (i.e., to achieve pure vertical motion). In the illustrated embodiment, each suspension spring 182 that attaches to a side 176 of the tuning element 174 is disposed perpendicularly to the reference axis 172, and each suspension spring 182 that attaches to an end 177 of the tuning element 174 is either parallel with or collinear with the reference axis 172.

The lifters 154, 186 in the embodiments of FIGS. 4A & 4B may provide various functions. The lifters 154, 186 may be used primarily to increase the spacing between the tuning element 138, 174 and the underlying substrate 134, 170 after the release of a tunable capacitor that was fabricated by surface micromachining. Subsequent movement of the tuning element 138, 174 to accomplish a change in capacitance would then be at least primarily due to a flexure or deformation of the suspension springs 146, 182 (i.e., the lifters 154, 186 would remain at least substantially stationary during movement of the tuning element 138, 174). Another option would be for the lifters 154, 186 to accommodate movement of the tuning element 138, 174 (a change in position) to provide a change in capacitance. This may be accomplished by a change in the amount of flexure in the relevant lifters 154, 186. The lifters 154, 186 could of course provide both functions. There also may be a situation where no lifters 154, 186 are required at all. In this case, the suspension springs 146, 182 could be anchored to any appropriate structure. For instance, an elevation system may not be required if the tuning element is fabricated at a different level than the first and second capacitor electrodes. Movement of the tuning element to change capacitance in this case could be provided entirely by flexure or deformation of the associated suspension springs.

Figure 4C:
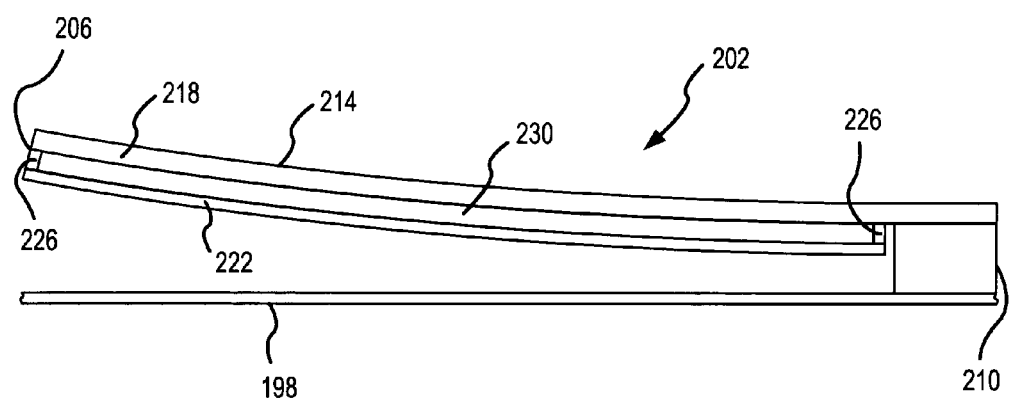
FIG. 4C is a cutaway, side view of one embodiment of a lifter that may be used by an elevation system for a tuning element of a tunable capacitor to allow the tuning element to move in a first dimension.

One embodiment of a lifter that may be used by the elevation system 142 of the FIG. 4A embodiment and by the elevation system 178 of the FIG. 4B embodiment is illustrated in FIG. 4C (as well as any other elevation system described herein for that matter) and is identified by reference numeral 202. The lifter 202 includes a free end or portion 206 that is able to move away from or toward a substrate 198, as well as an anchor 210 that fixes a portion of the lifter 202 to the substrate 198. Generally, the lifter 202 is fabricated such that it is pre-stressed so that its free end 206 bows or curves upwardly from the substrate 198 to a certain position in the vertical dimension without the application of an external force to the lifter 202. This pre-stressed condition is realized by fabricating the lifter 202 such that an oxide layer 230 is disposed within a polysilicon encasement 214 (i.e., the oxide layer 230 is enclosed, and not exposed). This polysilicon encasement 214 includes an upper polysilicon layer 218, a lower polysilicon layer 222, and an annular polysilicon sidewall 226 that extends from the upper polysilicon layer 218 to the lower polysilicon layer 222 along each side of the oxide layer 230 and along each end of the oxide layer 230 (e.g., around the perimeter of the oxide layer 230). The lower polysilicon layer 222 and the annular polysilicon sidewall 226 are each preferably thinner than the upper polysilicon layer 218.

The pre-stressed condition of the lifter 202 may be used to bias the free end 206 of the lifter 202 away from the substrate 198, and thereby bias a portion of a tuning element that is interconnected with the lifter 202 away from the substrate 198 as well (e.g., to dispose the tuning element 130 in the FIG. 3A position). External forces (e.g., electrostatic forces, such as by the application of an electrical signal to the capacitor electrodes 98, 114 in the embodiment of FIGS. 3A–B) may be used to bias or move the tuning element toward the substrate 198 (e.g., to dispose the tuning element 130 in the FIG. 3B position). The configuration of the lifter 202 may accommodate this movement by a movement of the free end 206 of the lifter 202 back toward the substrate 198 through bending/deflection of the lifter 202 at least generally about its associated anchor 210 (e.g., the lifter 202 assumes a flatter profile in the length dimension). Another option again would be for the free end 206 to remain at least generally in a constant, fixed position, and to allow the attached suspension spring(s) to flex or deform to allow the tuning element to move to change the capacitance.

Figure 4D:
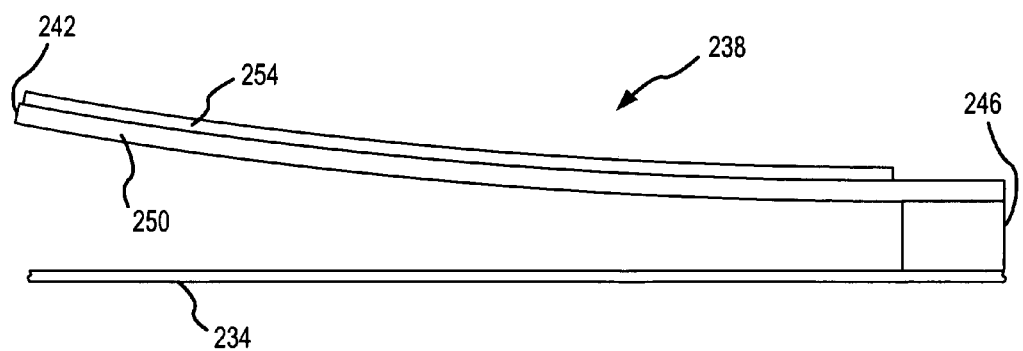
FIG. 4D is a side view of one embodiment of a lifter that may be used by an elevation system for a tuning element of a tunable capacitor to allow the tuning element to move in a first dimension.

Another embodiment of a lifter that may be used by the elevation system 142 of the FIG. 4A embodiment and by the elevation system 178 of the FIG. 4B embodiment (as well as any other elevation system described herein for that matter) is illustrated in FIG. 4D and is identified by reference numeral 238. The lifter 238 includes a free end or portion 242 that is able to move away from or toward a substrate 234, as well as an anchor 246 that fixes a portion of the lifter 238 to the substrate 234. Generally, the lifter 238 is fabricated such that it is pre-stressed so that its free end 242 bows or curves upwardly from the substrate 234 to a certain position in the vertical dimension without the application of an external force to the lifter 238. This pre-stressed condition may be realized by fabricating the lifter 238 to include a metal layer 254 (e.g., gold) that is deposited/formed on an upper surface of a polysilicon layer 250.

The pre-stressed condition of the lifter 238 may be used to bias the free end 242 of the lifter 238 away from the substrate 234, and thereby bias a portion of a tuning element that is interconnected with the lifter 238 away from the substrate 234 as well (e.g., to dispose the tuning element 130 in the FIG. 3A position). External forces (e.g., electrostatic forces, such as by the application of an electrical signal to the capacitor electrodes 98, 114 in the embodiment of FIGS. 3A–B) may be used to bias or move the tuning element toward the substrate 234 (e.g., to dispose the tuning element 130 in the FIG. 3B position). The configuration of the lifter 238 may accommodate this movement by a movement of the free end 242 of the lifter 238 back toward the substrate 234 through bending/deflection of the lifter 238 at least generally about its associated anchor 246 (e.g., the lifter 238 assumes a flatter profile in the length dimension). Another option again would be for the free end 242 to remain at least generally in a constant, fixed position, and to allow the attached suspension spring(s) to flex or deform to allow the tuning element to move to change the capacitance.

Both the lifter 202 of FIG. 4C and the lifter 238 of FIG. 4D use at least two different layers of material to introduce stresses in the resulting structure that causes the lifter to bend or bow in a desired manner for purposes of the tunable capacitors described herein. Any way of achieving a pre-stressed condition may be utilized. One or more of the layers of the lifter 202, 238 may attempt to expand or contract because of the pre-stressed condition. Depending upon the manner in which the lifter interfaces with its corresponding suspension spring(s), this may exert undesirable forces on the suspension spring that may adversely affect one or more aspects of the tunable capacitor (e.g., a buckling of the associated suspension spring(s)). Note that the arrangements illustrated in FIGS. 4A and 4B each have the length dimension of the lifter coaxial with the length dimension of the corresponding suspension spring.

Figure 5A:
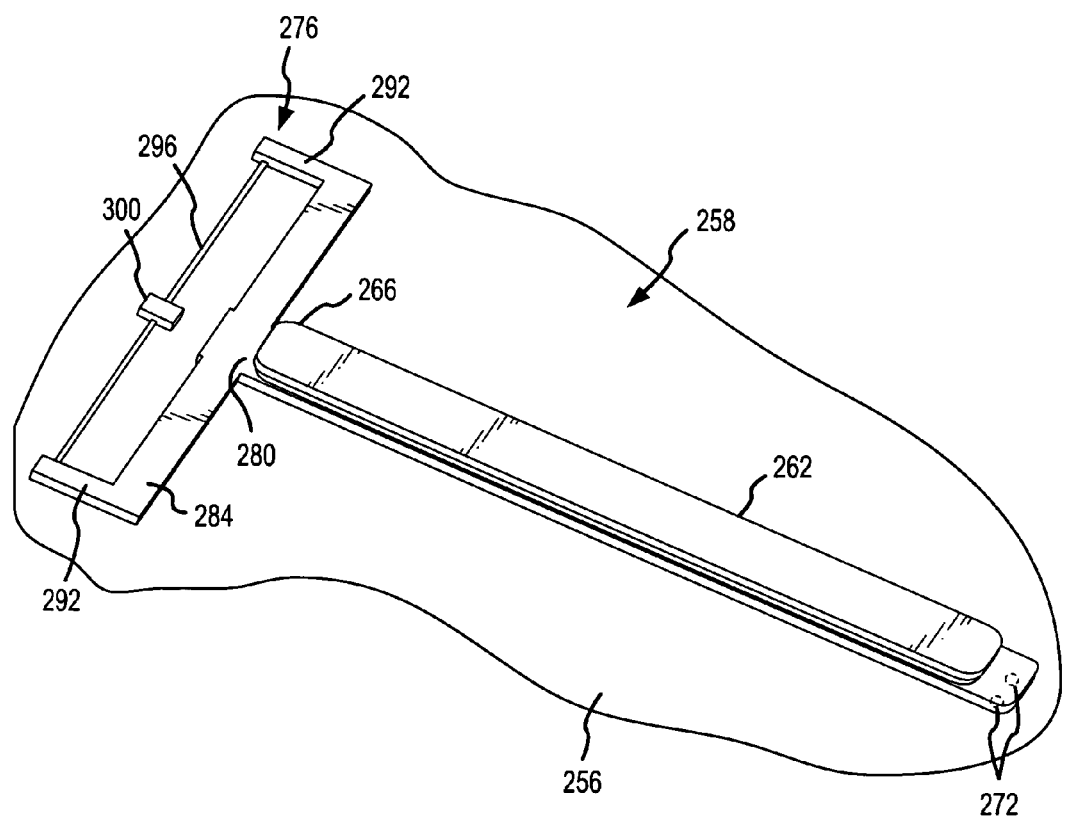
FIG. 5A is a perspective view of a lifter assembly for a tuning element of a tunable capacitor to allow the tuning element to move in a first dimension, and that includes a self-compensating suspension for interfacing a lifter of the lifter assembly with the tuning element.

One embodiment that at least potentially enhances the interface between a pre-stressed, multi-layered lifter and a suspension spring is illustrated in FIG. 5A. The lifter assembly 258 of FIG. 5A includes a pre-stressed lifter 262 (e.g., of the configuration of the lifter 202 or the lifter 238) and what may be characterized as a self-compensating suspension 276. The lifter 262 includes a free end or portion 266 that is able to move away from or toward a substrate 256, as well as an anchor 272 that fixes a portion of the lifter 262 to the substrate 256. The lifter 262 is appropriately fixed to the suspension 276 so that the suspension 276 moves along with the free end 266 of the lifter 262 (i.e., the lifter assembly 258 moves as a single unit).

The suspension 276 includes a cross beam 284, a cross beam 296, and a pair of interconnecting end beams 292. The cross beam 296 is narrower (i.e., not as wide) as the cross beam 284, and functions as a suspension spring for the self-compensating suspension 276. Hereafter the cross beam 296 will be referred to as a suspension spring 296. In contrast to the embodiments of FIGS. 4A and 4B, the suspension spring 296 is disposed in a perpendicular orientation (transversely disposed) relative to the lifter 262.

A load mount 300 is located at least generally at the midpoint of the suspension spring 296 (i.e., spaced equidistantly from each end beam 292) for attaching to a tuning element of the type described herein. Similarly, what may be characterized as an attachment node 280 is located at least generally at the midpoint of the cross beam 284 (i.e., spaced equidistantly from each end beam 292), and corresponds with the location where the lifter 262 joins the suspension 276. One benefit of this configuration is that any elongation or contraction of the cross beam 284 or the suspension spring 296 (i.e., so to change the spacing between the end beams 292 of the suspension 276) should not change the location of either the load mount 300 or the attachment node 280. Any elongation or contraction of the lifter 262 in its length dimension also should not change the location of either in the load mount 300 or the attachment node 280 relative to the end beams 292. Orienting the suspension spring 296 perpendicularly or orthogonally to the length dimension of the lifter 262 also should cause the suspension spring 296 to flex versus buckle upon any expansion or contraction of the lifter 262 along its length dimension. Other locations may be appropriate for the load mount 300 and the attachment node 280.

Figure 5B:
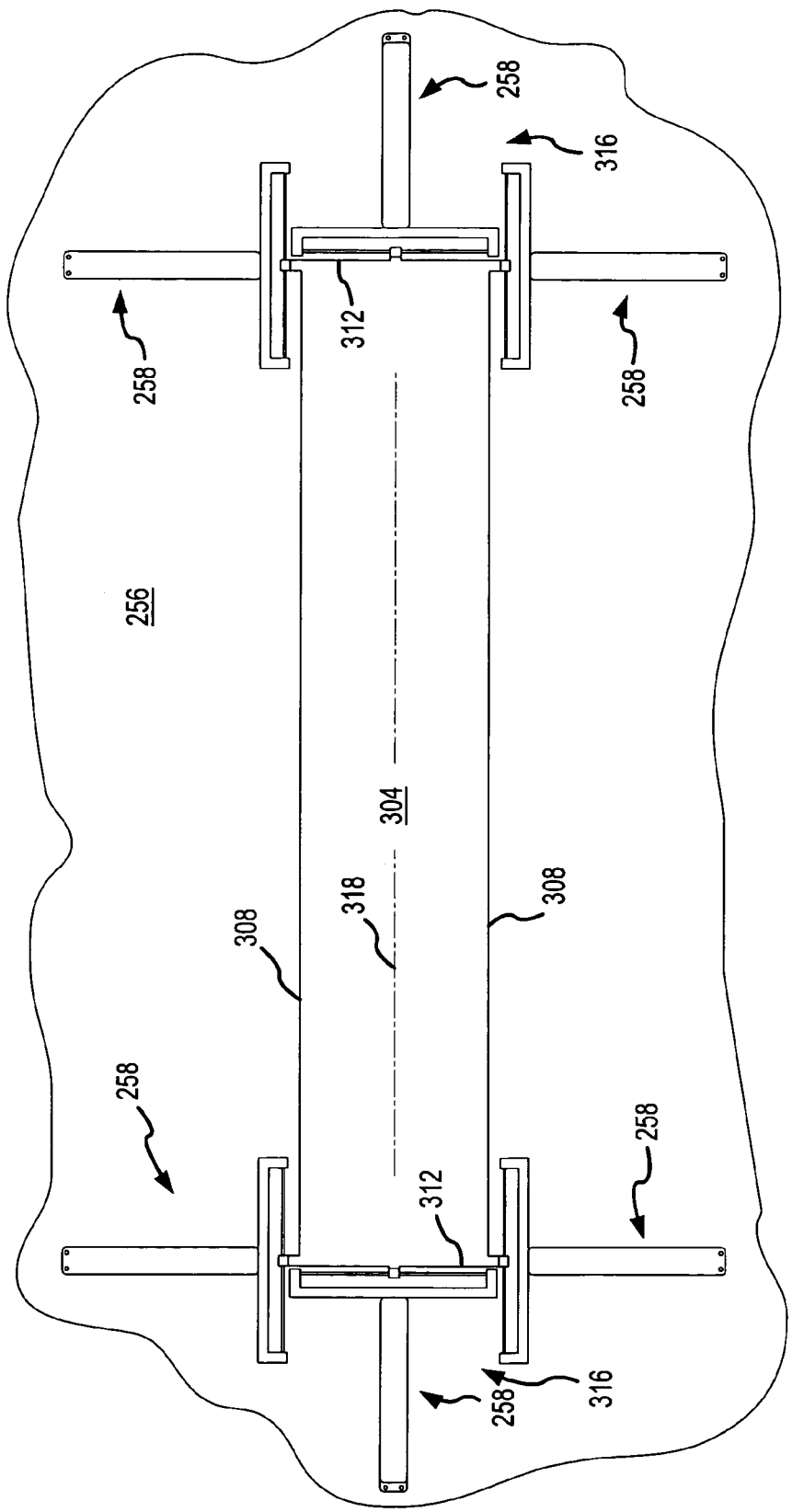
FIG. 5B is a top, plan view of one arrangement of a plurality of lifters of the type illustrated in FIG. 5A for moving a tuning element of a tunable capacitor in a first dimension.

FIG. 5B illustrates an elevation system 316 for suspending a tuning element 304 above the substrate 256 and allowing for a movement of this tuning element 304 in the vertical dimension. The tuning element 304 includes a pair of sides 308 and a pair of ends 312. The elevation system 316 utilizes an arrangement of a plurality of the lifter assemblies 258 illustrated in FIG. 5A. A pair of lifter assemblies 258 engage each side 308 of the tuning element 304 (via their corresponding load mount 300), while one lifter assembly 258 engages each end 312 of the tuning element 304 (via their corresponding load mount 300). Any number of lifter assemblies 258 may be associated with each of the sides 308 and each of the ends 312 of the tuning element 304. However, preferably the arrangement of lifter assemblies 258 is symmetrical.

The arrangement of lifter assemblies 258 on one side 308 of the tuning element 304 is the mirror image of the arrangement of lifter assemblies 258 on the opposite side 308 of the tuning element 304 in the embodiment of FIG. 5B. Similarly, the arrangement of lifter assemblies 258 on one and 312 of the tuning element 304 is the mirror image of the arrangement of lifter assemblies 258 on the opposite end 312 of the tuning element 304. Further with regard to the arrangement of the lifter assemblies 258 about the tuning element 304: 1) the lifter 262 of each lifter assembly 258 that engages a side 308 of the tuning element 304 is preferably disposed perpendicular to a reference axis 318 (e.g. along which the tuning element 304 extends); 2) the lifter 262 of each lifter assembly 258 that engages an end 312 of the tuning element 304 is preferably either collinear with (illustrated embodiment) or parallel to the reference axis 318; 3) the lifter 262 of each lifter assembly 258 on one side 308 of the tuning element 304 is preferably collinear with a lifter 262 associated with the opposite side 308 of the tuning element 304; and 4) the lifter 262 of each lifter assembly 258 on one end 312 of the tuning element 304 is preferably collinear with a lifter 262 associated with the opposite end 312 of the tuning element 304.

Figure 6A:
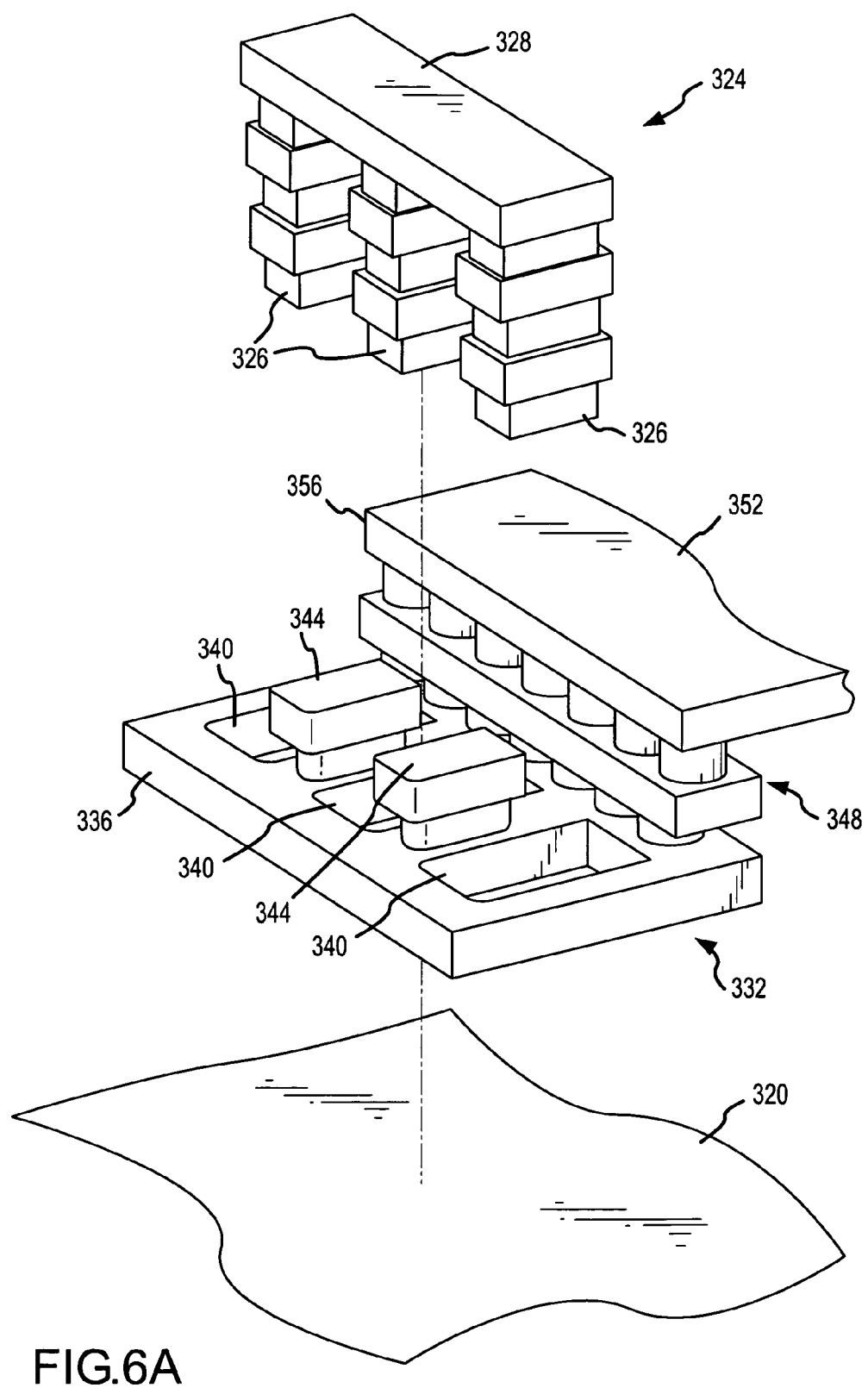
FIG. 6A is an exploded, perspective view of one embodiment of travel limiter for a lifter.
Figure 6B:
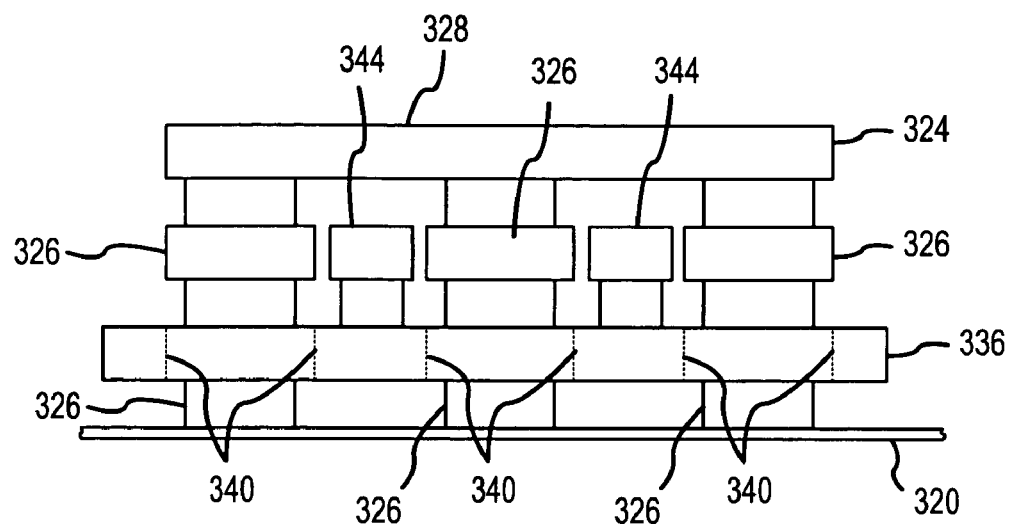
FIG. 6B is an end view of the travel limiter of FIG. 6A, with the free end of the lifter of FIG. 6A being in a first position in a first dimension.
Figure 6C:
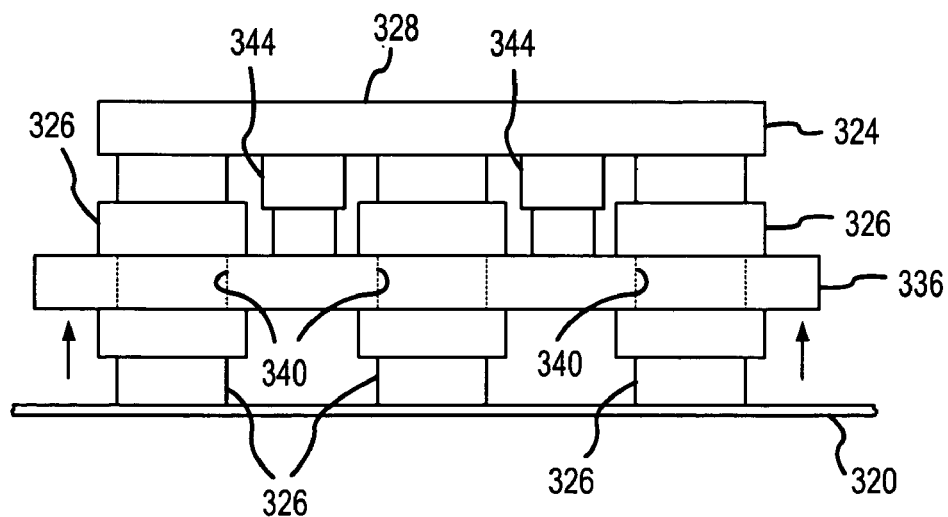
FIG. 6C is an end view of the travel limiter of FIG. 6A, with the free end of the lifter of FIG. 6A being in a second position in the first dimension.

An advantage of the lifters described herein is that external forces are not needed to move a free end of the lifter away from the substrate to which the lifter is attached (e.g., to dispose the lifter in a bowed or curved orientation). Stresses are "built" into the structure of the lifter to provide this feature for the lifters. In the case of the tunable capacitors described herein, it may be desirable to control the maximum distance that the free end of a given lifter is disposed above the substrate due to the pre-stressed condition of the lifter. Instead of attempting to design the lifter so that the stresses dispose the free end of the lifter at the desired vertical position above the substrate, a travel limiter or vertical stop may be utilized. One embodiment of such a travel limiter or vertical stop is illustrated in FIGS. 6A–C and is identified by a reference numeral 324. This travel limiter 324 may be used with any of the lifters/elevation systems described herein.

The travel limiter 324 of FIGS. 6A–C includes three support columns 326 that anchor to a substrate 320. Any appropriate number of columns 326 may be used. A cross beam 328 is attached to the upper end of these support columns 326 and functions as a vertical stop for the corresponding lifter(s)/elevation system. Therefore, the cross beam 328 of the travel limiter 324 is disposed a desired, fixed distance above the substrate 320. The position of this cross beam 328 relative to the substrate 320 defines the maximum distance that the free end of the lifter/elevation system may move away from the substrate 320. Other configurations for the travel limiter 324 may be appropriate. For instance, the cross beam 328 could be supported by a single, centrally disposed support 326 (e.g., a T-shaped profile) or by a single support 326 disposed more toward one end of the cross beam 328 (e.g., an inverted L-shaped structure).

A lifter attachment 332 is configured so as to be able to move relative to the travel limiter 324. The lifter attachment 332 includes a mount 336 having a plurality of apertures 340 that extend through the entire vertical extent of the mount 336. Each support column 326 of the travel limiter 324 extends through one of these apertures 340 in the mount 336 to attach to the substrate 320 (i.e., each support column 326 is vertically aligned with one of the apertures 340). Preferably the apertures 340 are sized so as to not adversely impede the ability of the mount 336 to move in the vertical dimension relative to the stationery travel limiter 324 (e.g., each aperture 340 is preferably at least slightly larger than its corresponding support column 326 such that at least a small space exists between the mount 336 and each support column 326 at all times).

One or more stops 344 may be formed on the upper surface of the mount 336. In the illustrated embodiment, one stop 344 is disposed between each aperture 340. A certain amount of movement of the mount 336 relative to the travel limiter 324 will bring the stops 344 into engagement with the lower surface of the cross beam 328 to terminate further movement of the mount 336 in the vertical dimension. The mount 336 itself could be that structure that engaged the lower surface of the cross beam 328 to terminate further movement of the mount 336 in the vertical dimension. Other configurations for the stops 344 could also be utilized.

The mount 336 is interconnected with and moves with a pre-stressed lifter 352 (e.g., of the FIG. 4C or 4D configuration). In this regard, a lifter interconnector 348 is attached to the mount 336, and a free end 356 of the lifter 352 is attached to the lifter interconnector 348. Any appropriate configuration may be utilized for the lifter interconnector 348. The position of the free end or portion 356 of the lifter 352 is used to control the position of a tuning element in the vertical dimension in relation to a pair of coplanar capacitor electrodes.

The travel limiter 324 defines the maximum distance that the free end 356 of the lifter 352 may be disposed above the substrate 320. Referring to FIG. 6B, the free end 356 of the lifter 352 is in a vertical position relative to the substrate 320 such that the stops 344 are disposed in vertically spaced relation to the cross beam 328 of the travel limiter 324 (e.g., corresponding with the position of the tuning element 130 illustrated in FIG. 3B). Referring to FIG. 6C, the free end 356 of the lifter 352 is now in a vertical position relative to the substrate 320 such that the stops 344 have engaged the lower surface of the cross beam 328 (e.g., corresponding with the position of the tuning element 130 illustrated in FIG. 3A). That is, the stresses in the lifter 352 have caused its free end 356 to move further away from the substrate 320. Since the mount 336 is structurally interconnected with the lifter 352, this also changes the vertical position of the mount 336 relative to the travel limiter 324. Eventually, the stops 344 on the mount 336 will engage the lower surface of the cross beam 328 to terminate further movement of the free end 356 of the lifter 352 in the vertical dimension. Any remaining stresses in the lifter 352 thereby should not increase the vertical spacing between the free end 356 of the lifter 352 above the substrate 320 to any significant degree. Preferably, the cross beam 328 of the travel limiter 324 is disposed in the vertical dimension such that the stops 344 are in forcible contact with the lower surface of the cross beam 328. Stated another way, the cross beam 328 should be disposed at a lower elevation relative to the substrate 320 than the "steady state" position of the free end 356 of the lifter 352 (the position the free end 356 would move to if not vertically restrained, at which time the stresses are no longer able to move the free end 356).

The position of the lifter 352 in FIG. 6C may be the "steady state" position for the lifter 352 after the release. That is, the free end 356 of the lifter may remain at least generally in a fixed or stationary position throughout operation of the tunable capacitor. Again, movement of the tuning element in this case would then be provided by a flexure or deformation of the suspension springs that support the tuning element above the substrate. However, it may be possible to move the free end 356 of the lifter 356 away from the cross beam 328 to allow the tuning element to move relative to the substrate for purposes of changing the capacitance as noted.

FIGS. 7A–B illustrate an embodiment of a tunable capacitor that uses the principles of the tunable capacitor 90 of FIGS. 3A–B and that is identified by a reference numeral 368. Desirably, the tunable capacitor 368 may be fabricated by surface micromachining. One particularly desirable surface micromachining technique is described in U.S. Pat. No. 6,082,208, that issued Jul. 4, 2000, that is entitled "Method For Fabricating Five-Level Microelectromechanical Structures and Microelectromechanical Transmission Formed," and the entire disclosure of which is incorporated by reference in its entirety herein. The fabrication technology described in the '208 patent uses a plurality of alternating structural and sacrificial layers as will be discussed in more detail below. The five vertically spaced structural layers (commonly polysilicon) associated with the '208 patent are oftentimes referred to as the $P_0$ layer, the $P_1$ layer, the $P_2$ layer, the $P_3$ layer, and the $P_4$ layer, with the $P_0$ layer being located closest to the substrate and with the $P_4$ layer being located furthest from the substrate. This nomenclature will be used herein.

General components of the tunable capacitor 368 of FIGS. 7A–B include a substrate 388, a pair of capacitor electrodes 392, a tuning element 416, and an elevation system 460. The pair of capacitor electrodes 392 are disposed a common distance above the substrate 388 (i.e., the capacitor electrodes 392 are spaced in the vertical dimension from the substrate 388), are maintained in a fixed or stationery position relative to the substrate 388, and are spaced in the lateral dimension. Preferably, the pair of capacitor electrodes 392 are coplanar. The tuning element 416 is movably interconnected with the substrate 388 by the elevation system 460. The elevation system 460 biases the tuning element 416 away from the substrate 388, and further allows for movement of the tuning element 416 in the vertical dimension. Changing the position of the tuning element 416 in the vertical dimension changes the capacitance of the tunable capacitor 368. Preferably, the orientation of the tuning element 416 is maintained during movement in the vertical dimension (e.g., no substantial movement of the tuning element 416 in the horizontal dimension, and the tuning element 416 remains parallel with the substrate 388).

Any appropriate material may be used for the substrate 388. Preferably the substrate 388 is compatible with surface micromachining, which is the preferred fabrication technique for the tunable capacitor 368. In one embodiment, the substrate 388 is silicon or silicon-based. It may be desirable for at least certain applications for the substrate 388 to have either a high or a low resistivity.

Figure 8A:
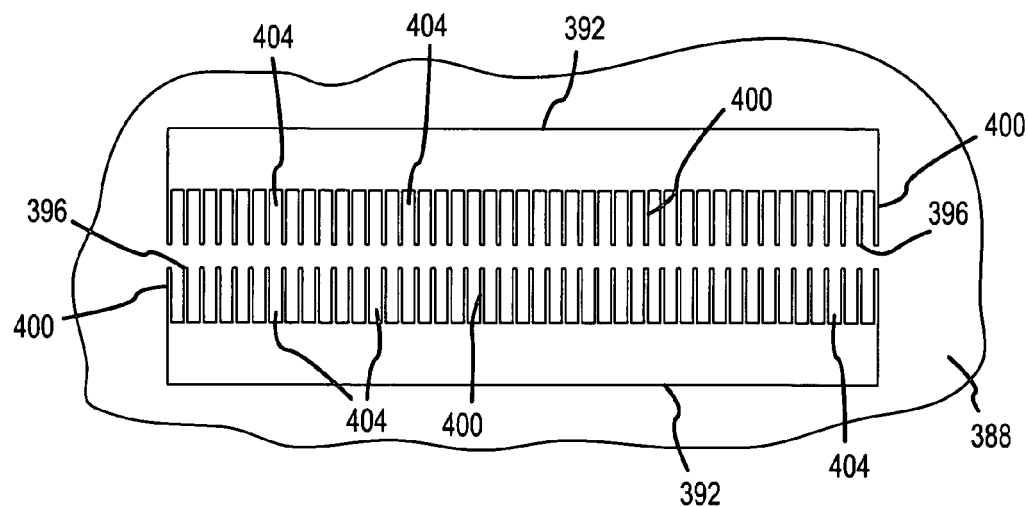
FIG. 8A is a top, plan view of the pair of coplanar, stationary capacitor electrodes used by the tunable capacitor of FIGS. 7A–7B.
Figure 8B:
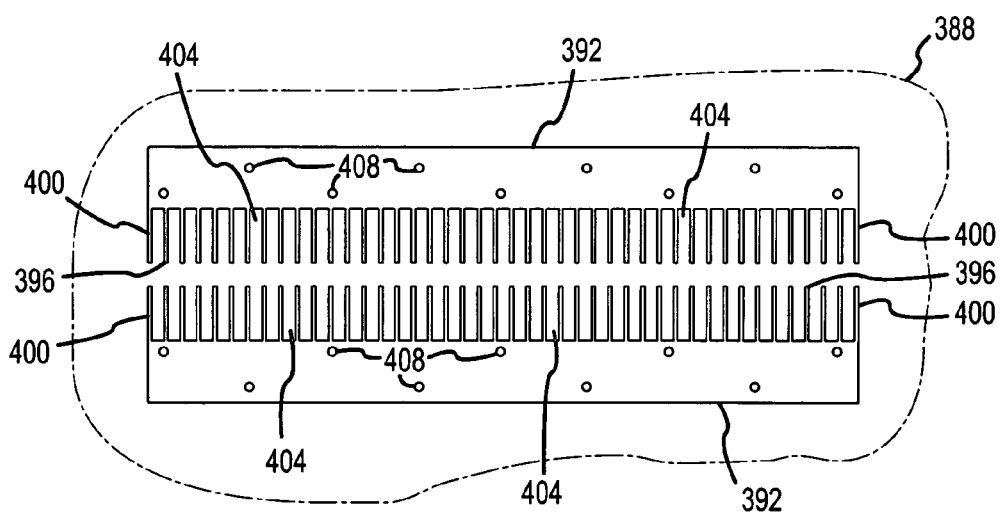
FIG. 8B is a bottom, plan view of the stationary capacitor electrodes of FIG. 8A.
Figure 8C:
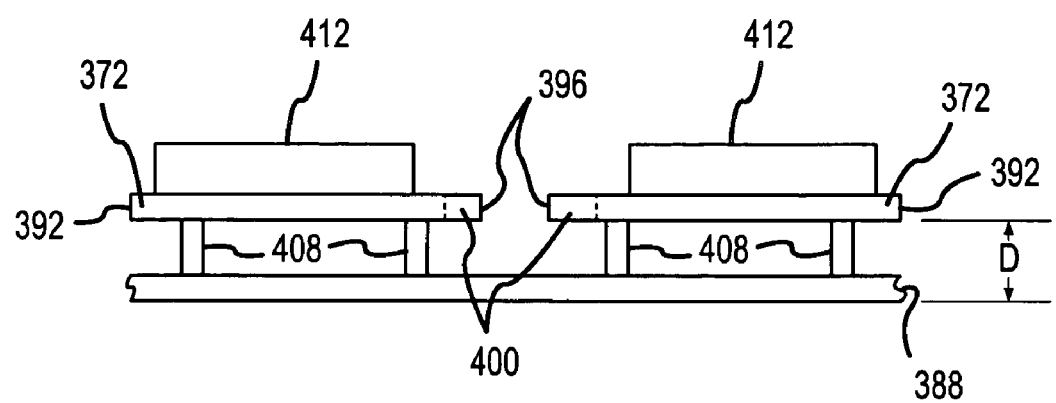
FIG. 8C is an end view of the stationary capacitor electrodes of FIG. 8A with the conductors disposed thereon.

Details regarding the capacitor electrodes 392 are illustrated in FIGS. 8A–C, in addition to FIGS. 7A–B noted above. Generally, the capacitor electrodes 392 may be of any appropriate configuration and formed from any appropriate material or combination of materials. The preferred embodiment is to fabricate the capacitor electrodes 392 from polysilicon by surface micromachining.

The pair of capacitor electrodes 392 are disposed a common distance above the substrate 388 in the vertical dimension (orthogonal to the substrate 388, and represented by the dimension "D" in FIG. 8C) in a fixed positional relationship to the substrate 388. The capacitor electrodes 392 may be fabricated in a common structural layer by surface micromachining. The fixed spacing and fixed positional relationship is provided by a plurality of support columns or anchors 408. One end of each support column 408 is fixed to the lower surface of the corresponding capacitor electrode 392, while the opposite end of each support column 408 is fixed to the substrate 388. The pair of capacitor electrodes 392 are also spaced in a lateral or horizontal dimension that is orthogonal to the vertical dimension (parallel with the substrate 388).

Each capacitor electrode 392 includes an edge 396 (FIG. 8C) that is collectively defined by the ends of a plurality of spaced projections 400. A gap 404 is disposed between each adjacent pair of projections 400 for both capacitor electrodes 392. The edges 396 of the capacitor electrodes 392 are disposed in parallel relation and project toward each other (i.e., the projections 400 of one capacitor electrode 392 point toward the projections 400 of the other capacitor electrode 392). The gap 404 between adjacent projections 400 on each of the capacitor electrodes 392 defines a capacitive gap as will be discussed in more detail below.

The plurality of projections 400 of each capacitor electrode 392 are disposed in parallel relation, and the projections 400 of one capacitor electrode 392 are parallel with the projections 400 of the other capacitor electrode 392. Adjacent projections 400 are preferably separated by a common spacing (i.e., the width of each gap 404 is preferably the same for both capacitor electrodes 392). Any appropriate spacing may be used between adjacent projections 400 on both capacitor electrodes 392. The projections 400 may be of any appropriate thickness, length, width, and/or shape, and further may be disposed in any appropriate orientation. Typically, the length and the width of the projections 400 may be selected so that the projections 400 have sufficient rigidity in the lateral dimension for the voltages that are being applied to the capacitor electrodes 392.

Both capacitor electrodes 392 may be fabricated in the same structural layer when using surface micromachining to fabricate the tunable capacitor 368 (e.g., a $P_4$ layer 372). Details regarding a currently preferred fabrication process (surface micromachining) are discussed in more detail below in relation to FIGS. 12A–M. Generally, multiple, vertically spaced layers of an appropriate structural material (e.g., polysilicon) may be used in the fabrication of the tunable capacitor 368. These vertically spaced structural layers may be separated by a layer of an appropriate sacrificial material (e.g., silicon dioxide) during the fabrication of the tunable capacitor 368 by surface micromachining. Adjacent structural layers may be structurally interconnected by patterning an overlying layer of sacrificial material, and then depositing a structural layer over the structural layer and into the opening(s) formed in the sacrificial layer (and that extend down to the underlying structural layer). The capacitor electrodes 392 are fabricated in a $P_4$ layer 372 in the illustrated embodiment. One way to define the capacitor electrodes 392 would be to pattern the $P_4$ layer 372 to define a plurality of spaced gaps 404. Removing portions of the $P_4$ layer 372 to define the plurality of spaced gaps 404 would then in turn define the plurality of spaced projections 400.

Polysilicon has a relatively high electrical resistance. The capacitor electrodes 392 are preferably formed from polysilicon as previously noted. In order to provide a desired quality for the tunable capacitor 368, a separate conductor 412 is formed on the upper surface of each capacitor electrode 392. Each conductor 412 has a smaller electrical resistance than the corresponding capacitor electrode 392, and more preferably a much smaller electrical resistance than the corresponding capacitor electrode 392. The conductors 412 may not be required if the capacitor electrodes 392 themselves are sufficiently electrically conductive.

There are a number of additional notables regarding the conductors 412. One is that no portion of the conductor 412 is disposed over/on any of the projections 400 of the capacitor electrodes 392. That is, the conductors 412 are each spaced back from the projections 400 on their corresponding capacitor electrode 392. There may be instances where it is acceptable or even desirable for the conductors 412 to be disposed over the entirety of each of the projections 400 or to be partially disposed over each of the projections 400. Another notable is that wires (e.g., electrical leads, such as the electrical leads 110, 126 noted above in relation to the embodiment of FIGS. 3A–B) may be directly bonded to each of the conductors 412 (e.g., their upper surface).

Metals are appropriate materials for the conductors 412. The currently preferred material for the conductors 412 is gold. Formation of the conductors 412 may be undertaken after all of the various structural and intermediate sacrificial layers have been formed/patterned by surface micromachining to define the various other structural components of the tunable capacitor 368, but preferably before the release etch. The conductors 412 are thereby not exposed to the elevated temperatures that may be used in the formation/patterning of these structural/sacrificial layers, which would likely evaporate the material defining the conductors 412.

The tuning element 416 is movable in the vertical dimension into and out of the lateral space between the pair of capacitor electrodes 392 to vary the capacitance of the tunable capacitor 368. The tuning element 416 may be formed from any appropriate material or combination of materials, including a dielectric material or materials, a conductive material or materials, or a material or combination of materials that have both dielectric and conductive properties. The preferred embodiment is to fabricate the tuning element 416 from polysilicon by surface micromachining. Although the tuning element 416 may be formed from a single material, it may utilize a laminated structure as well. For instance, the tuning element 416 could be formed from multiple layers of at least two different materials to achieve one or more desired properties or characteristics. In one embodiment, at least part of the upper surface of the tuning element 416 includes a metalization layer. Although it may be required that such a metallization not extend over the projections 432 in at least certain cases, other situations may allow such a metallization to extend entirely or at least partially over each of the projections 432.

Figure 9A:
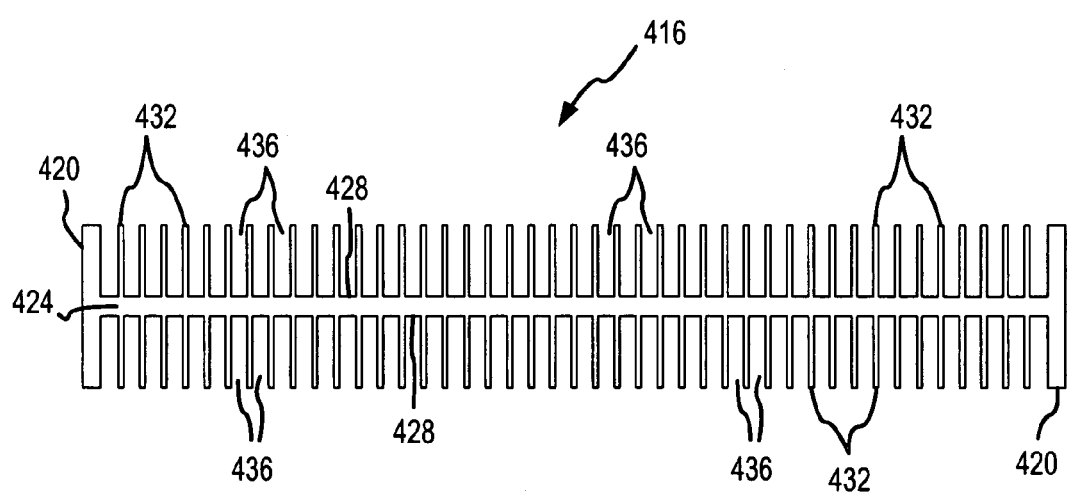
FIG. 9A is a top, plan view of the movable tuning element used by the tunable capacitor of FIGS. 7A–B.
Figure 9B:
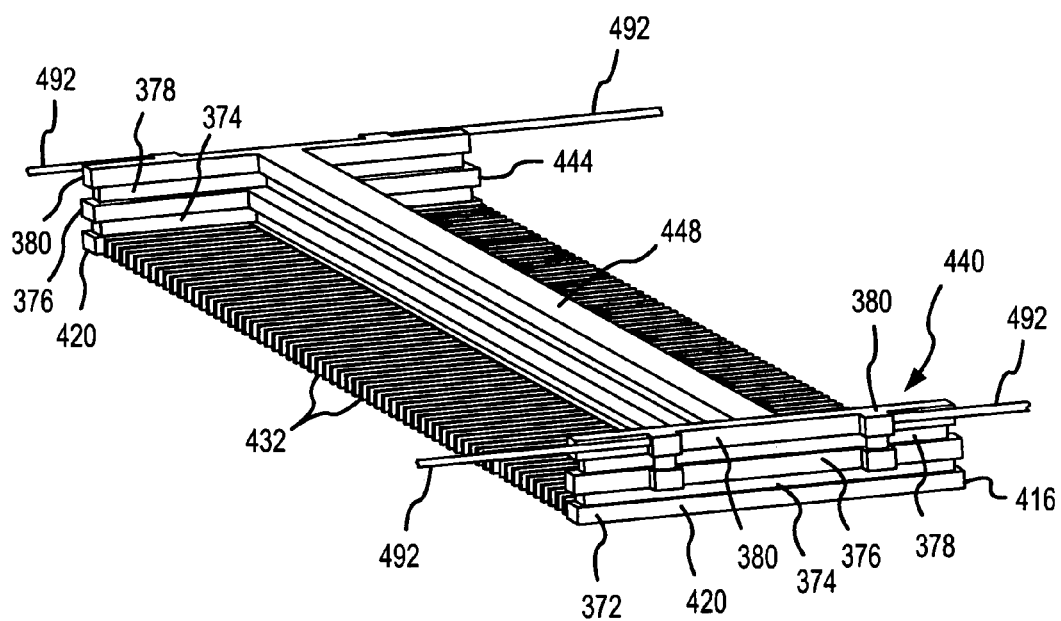
FIG. 9B is a perspective view of the bottom of the tuning element of FIG. 9A, illustrating an associated reinforcement assembly.

Details regarding the tuning element 416 are illustrated in FIGS. 9A–B, in addition to FIGS. 7A–B noted above. The tuning element 416 includes an end beam 420 that is disposed on each end of a center beam 424. A plurality of projections 432 extend from the center beam 424 in each of two directions, with adjacent pairs of projections 432 being separated by a gap 436.

The plurality of projections 432 of the tuning element 416 on each side of the center beam 424 are disposed in parallel relation, and each projection 432 on one side of the center beam 424 is axially aligned with one projection 432 on the opposite side of the center beam 424. Adjacent projections 432 are preferably separated by a common spacing (i.e., the width of each gap 436 is preferably the same throughout the tuning element 416). Any appropriate spacing may be used between adjacent projections 432. However, the projections 432 may be of any appropriate thickness, length, width, and/or shape, and further may be disposed in any appropriate orientation. Typically the length and the width of the projections 400 may be selected so that the projections 432 have sufficient rigidity in the lateral dimension for the voltages that are being applied to the capacitor electrodes 392.

The projections 432 of the tuning element 416 are parallel with the projections 400 of the capacitor electrodes 392 in illustrated embodiment. It may be desirable for the dimensions of the projections 432 of the tuning element 416 to be the same as the dimensions for the projections 400 of the capacitor electrodes 392, although such need not be the case. It may also be desirable for the width of the gaps 400 associated with the capacitor electrodes 392 to the same as the width of the gaps 436 associated with the tuning element 416, although such need not be the case.

The tuning element 416 may be fabricated in the same layer as both capacitor electrodes 392 (the $P_4$ layer 372 in the illustrated embodiment). One way to define the tuning element 416 would be to pattern the $P_4$ layer 372 to define a plurality of spaced gaps 436. Details regarding the fabrication of the capacitor electrodes 392 and the tuning element 416 again are addressed in more detail below in relation to FIGS. 12A–M. Removing portions of the $P_4$ layer 372 to define the plurality of spaced gaps 436 would then in turn define the plurality of spaced projections 432.

Generally, the tuning element 416 is positioned relative to the pair of capacitor electrodes 392 such that each projection 432 on the tuning element 416 is vertically aligned with one of the gaps 404 on one of the capacitor electrodes 392. Preferably each such projection 432 is centrally disposed in this gap 404 (i.e., equidistant from each of the projections 400 that define the particular gap 404). Changing the amount that each projection 432 of the tuning element 416 extends vertically into its corresponding gap 404 of its corresponding capacitor electrode 392 in the vertical dimension (e.g., perpendicularly to the capacitor electrodes 392) changes the capacitance between the adjacent projections 400 that define this particular gap 404.

The tuning element 416 may be defined by a single structural layer, namely the $P_4$ layer 372 in the illustrated embodiment. It may be desirable to increase the rigidity or stiffness of the tuning element 416. In this regard and referring to FIG. 9B, the tunable capacitor 368 may include a reinforcement assembly 440 for the tuning element 416. The reinforcement assembly 440 includes an end beam 444 on each end of a center beam 448. Each end beam 444 of the reinforcement assembly 440 corresponds with and is attached to one of the end beams 420 of the tuning element 416. Similarly, the center beam 448 of the reinforcement assembly 440 corresponds with and is attached to the center beam 424 of the tuning element 416. Multiple, vertically spaced structural layers define the reinforcement assembly 440 in the illustrated embodiment where surface micromachining is used to fabricate the tunable capacitor 368. Specifically, each end beam 444 and the center beam 448 of the reinforcement assembly 440 are defined by a $P_3$ layer 376 that is vertically spaced from the noted $P_4$ layer 372, and a $P_2$ layer 380 that is vertically spaced from the $P_3$ layer 376 (the $P_3$ layer 376 being located between the $P_4$ layer 372 and the $P_2$ layer 380, and the $P_2$ layer 380 being between the $P_3$ layer 376 and the substrate 388). The same material that defines the $P_4$ layer 372 is deposited in an aperture in the sacrificial layer between the $P_4$ layer 372 and the $P_3$ layer 376 to define an anchor 374 between the $P_4$ layer 372 and the $P_3$ layer 376 for each of the end beams 444 and the center beam 448 of the reinforcement assembly 440 associated with the tuning element 416. Similarly, the same material that defines the $P_3$ layer 376 is deposited in an aperture in the sacrificial layer between the $P_3$ layer 376 and the $P_2$ layer 380 to define an anchor 378 between the $P_3$ layer 376 and the $P_2$ layer 380 for each of the end beams 444 and the center beam 448 of the reinforcement assembly 440 associated with the tuning element 416. The reinforcement assembly 440 and the tuning element 416 collectively move as a single unit.

Figure 10A:
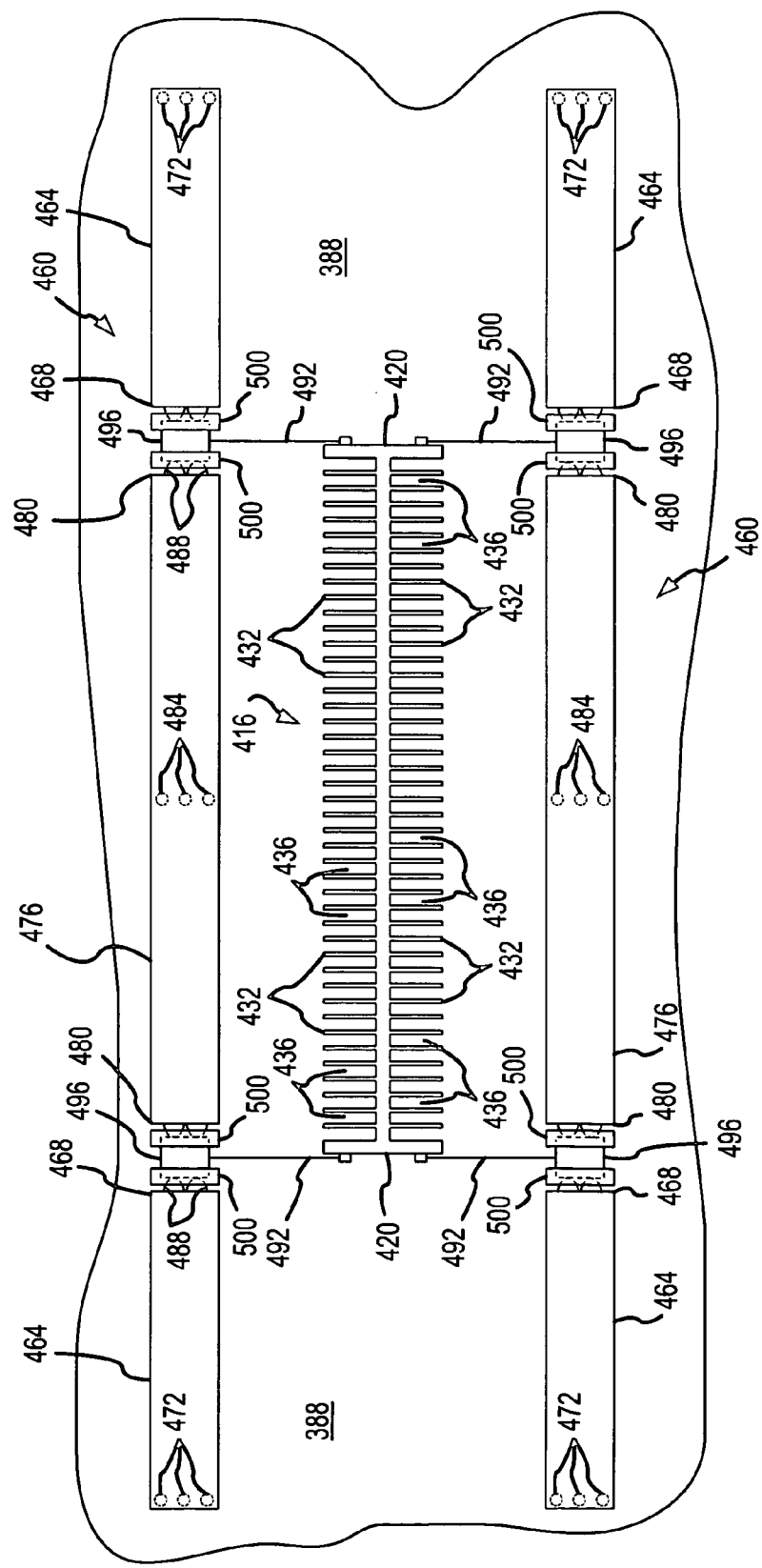
FIG. 10A is a top, plan view that illustrates an elevation system for the tuning element of the tunable capacitor of FIGS. 7A–B.
Figure 10B:
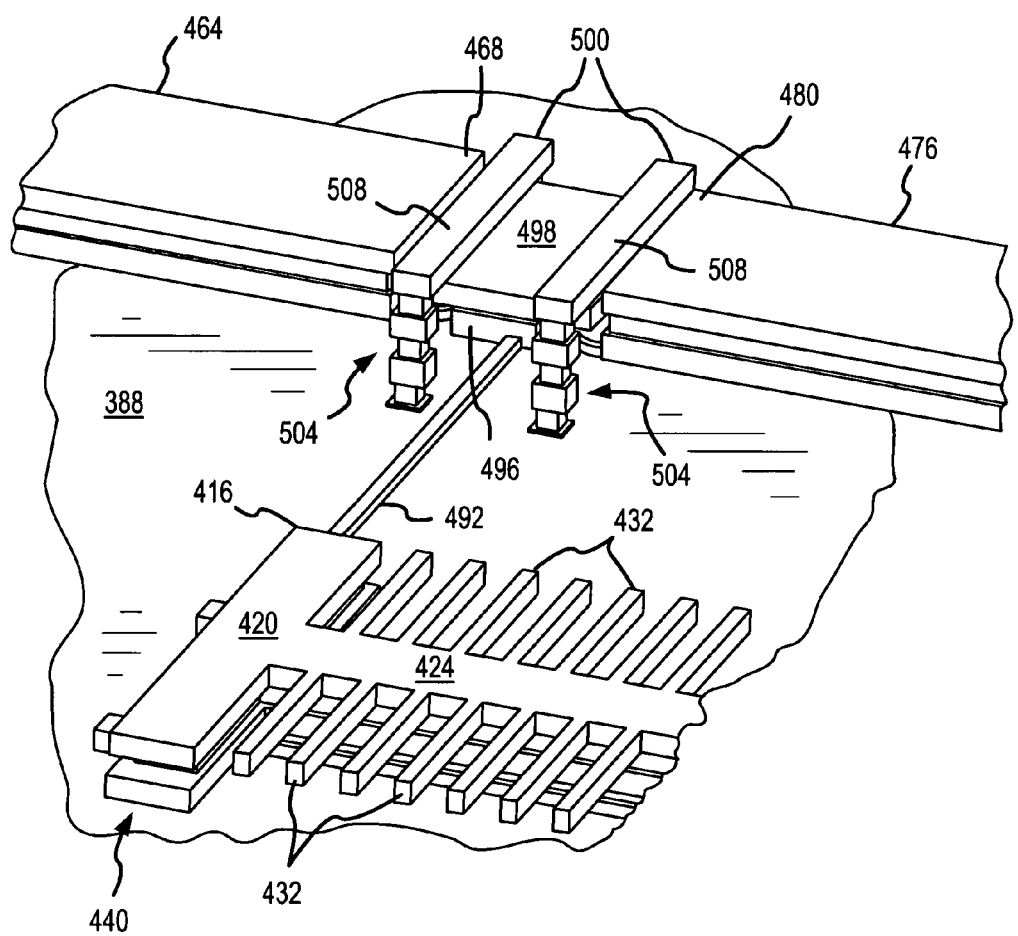
FIG. 10B is a perspective view of one of the suspension springs and its interconnection with a pair of lifters of the elevation system of FIG. 10A.
Figure 10C:
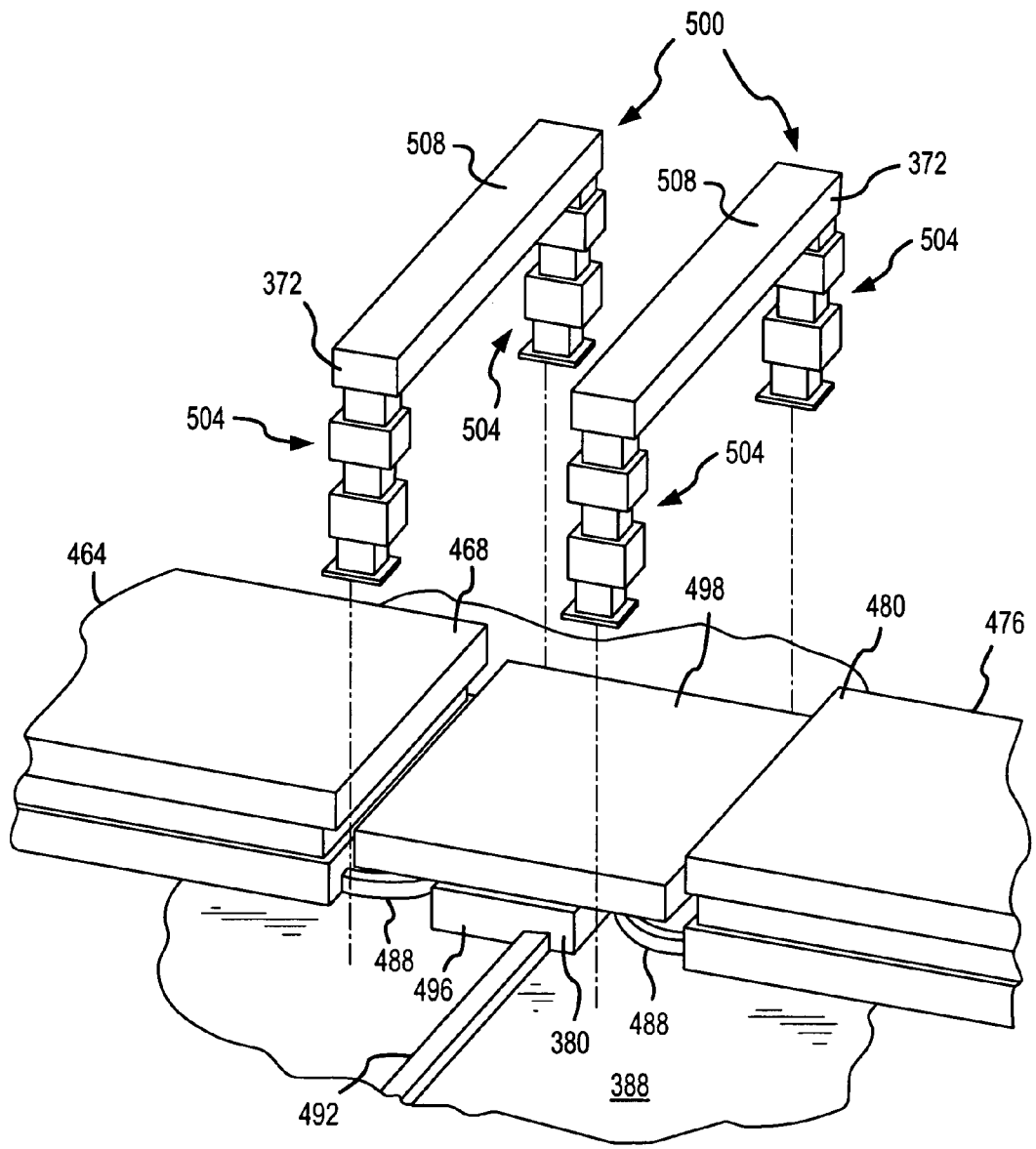
FIG. 10C is an exploded, perspective view of a travel limiter used by the elevation system of FIG. 10A.

The tuning element 416 is spaced from the substrate 388 in the vertical dimension by the elevation system 460 that is illustrated in FIGS. 10A–C, in addition to FIGS. 7A–B noted above. A suspension spring 492 extends from each end beam 444 of the reinforcement assembly 440 associated with the tuning element 416 to structurally interconnect the elevation system 460 with the tuning element 416. That is, the suspension springs 492 are indirectly interconnected with the tuning element 416 (via the intermediate reinforcement assembly 440). It may be possible for the suspension springs 492 to be directly attached to the tuning element 416 as well (e.g., an alternative for interconnecting the suspensions springs 492 and the tuning element 416). The suspension springs 492 are axially or linearly extending beams of reduced structural dimensions, are disposed parallel with the substrate 388 (i.e., disposed at a common elevation in the vertical dimension), and are parallel with each other in the illustrated embodiment. Other configurations and positionings may be appropriate.

The elevation system 460 includes a dual action lifter 476 that is disposed between a pair of single action lifters 464 on each side of the tuning element 416. Each dual action lifter 476 and its corresponding pair of single action lifters 464 are disposed along a common axis. Each dual action lifter 476 and its corresponding pair of single action lifters 464 are spaced from the tuning element 416 to accommodate disposition of one of the capacitor electrodes 392 therebetween.

Each dual action lifter 476 is fixed to the substrate 388 by one or more anchors 484. The anchor(s) 484 associated with each dual action lifter 476 are disposed midway between a pair of free ends or portions 480 of the dual action lifter 476. Similarly, each single action lifter 464 is fixed to the substrate 388 by one or more anchors 472. Each single action lifter 464 further includes a free end or portion 468.

Each free end 480 of each dual action lifter 476 is interconnected with one of the suspension springs 492 (indirectly in the illustrated embodiment, and as will be discussed below). Similarly, the free end 468 of each single action lifter 464 is interconnected with one of the suspension spring's 492 as well (indirectly in the illustrated embodiment, and as will be discussed below). Therefore, each suspension spring 492 is interconnected with both the free end 468 of a single action lifter 464 and one free end 480 of one of the dual action lifters 476. Each single action lifter 464 and one half of the corresponding dual action lifter 476 may be considered as being disposed in opposing relation, and in effect move in the manner of a draw bridge to change the position of the corresponding suspension spring 492 in the vertical dimension. Any change in position of the suspension spring 492 changes the position of the corresponding portion of the tuning element 416 in the vertical position as well.

It should be appreciated that various arrangements could be used for controlling the position of the tuning element 416 of the tunable capacitor 368 in the vertical dimension. For instance, the elevation system 142 discussed above in relation to FIG. 4A, the elevation system 178 discussed above in relation to FIG. 4B, the lifter assembly 258 discussed above in relation to FIG. 5A, or the elevation system 316 discussed above in relation to FIG. 5B could be used by the tunable capacitor 368. Any combination of the same could be used as well. For instance, one lifter assembly 258 could be used in relation to each end beam 420 of the tuning element 416, in combination with the disclosed elevation system 460 (e.g., one lifter assembly 258 could be attached to each of the end beams 420 of the reinforcement assembly 440 for the tuning element 416). In addition and as also previously noted, it may be possible to not use an elevation system at all. For instance, the tuning element 416 could be fabricated at a different level than the capacitor electrodes 392, and the movement of the tuning element 416 to change capacitance could be provided through deforming or flexing the suspension springs 492. For instance, one end of each suspension spring 492 could be anchored to the tuning element 416, and its opposite end could be anchored to an appropriate stationary support that is anchored to the substrate 388. In fact, each suspension spring 492 may be anchored to any appropriate structure that is in turn appropriately interconnected with the substrate 388.

Details regarding the interaction between the end of the suspension springs 492 and their corresponding single action lifter 464 and corresponding dual action lifter 476 are illustrated in FIG. 10B, in addition to FIGS. 7A–B noted above. The distal end of each suspension spring 492 is fixed to a mount 496. This mount 496 is disposed between a pair of travel limiters 500 that will be discussed in more detail below. A pair of semi-circular flexible interconnects 488 extend from the free end 468 of a single action lifter 464 and from an adjacent free end 480 of a corresponding dual action lifter 476. The flexible interconnects 488 are attached to both the mount 496 and the corresponding single action lifter 464 or dual action lifter 476. This allows the free end 468 of the single action lifter 464 and the free end 480 of the dual action lifter 476 to move in the vertical dimension relative to the substrate 388 to change the spacing between the corresponding suspension spring 492 and the substrate 388 in the vertical dimension, and thereby to change the spacing between the corresponding portion of the tuning element 416 and the substrate 388 in the vertical dimension as well.

The tunable capacitor 368 also includes a plurality of travel limiters 500 to control the maximum spacing from the substrate 388 of each single action lifter 464 and each dual action lifter 476 in the vertical dimension. Any appropriate configuration may be used for each travel limiter 500. Each travel limiter 500 generally includes a cross beam 508 that is anchored to the substrate 388 by a plurality of support columns 504. In the illustrated embodiment, the cross beam 508 may be fabricated in the $P_4$ layer 372. Generally, each mount 496 is disposed at a lower elevation (i.e., closer to the substrate 388) than the cross beam 508 of its corresponding travel limiter 500. The mount 496 may be fabricated in the $P_2$ layer 380. Although contact between the mount 496 itself and the cross beam 508 of its corresponding travel limiter 500 could be used to control the maximum vertical spacing of the corresponding single action lifter 464 or dual action lifter 476 above the substrate 388, in the illustrated embodiment a stop 498 is disposed on the mount 496 for engaging the lower surface of the cross beam 508 of the corresponding travel limiter 500. The stop 498 may be formed in the spacing between the $P_3$ layer 376 and the $P_2$ layer 380. Generally, the same material that defines the $P_3$ layer 376 is deposited in an aperture in the sacrificial layer between the $P_3$ layer 376 and the $P_2$ layer 380 (which again defines the mount 496) to define the stop 498.

The configuration of the tunable capacitor 368 described herein in effect defines a plurality of smaller capacitors that are disposed electrically in parallel. That is, each pair of adjacent projections 400 for both capacitor electrodes 392 defines a "sub-capacitor". Any appropriate number of "sub-capacitors" may be formed on each capacitor electrode 392.

Figure 11A:
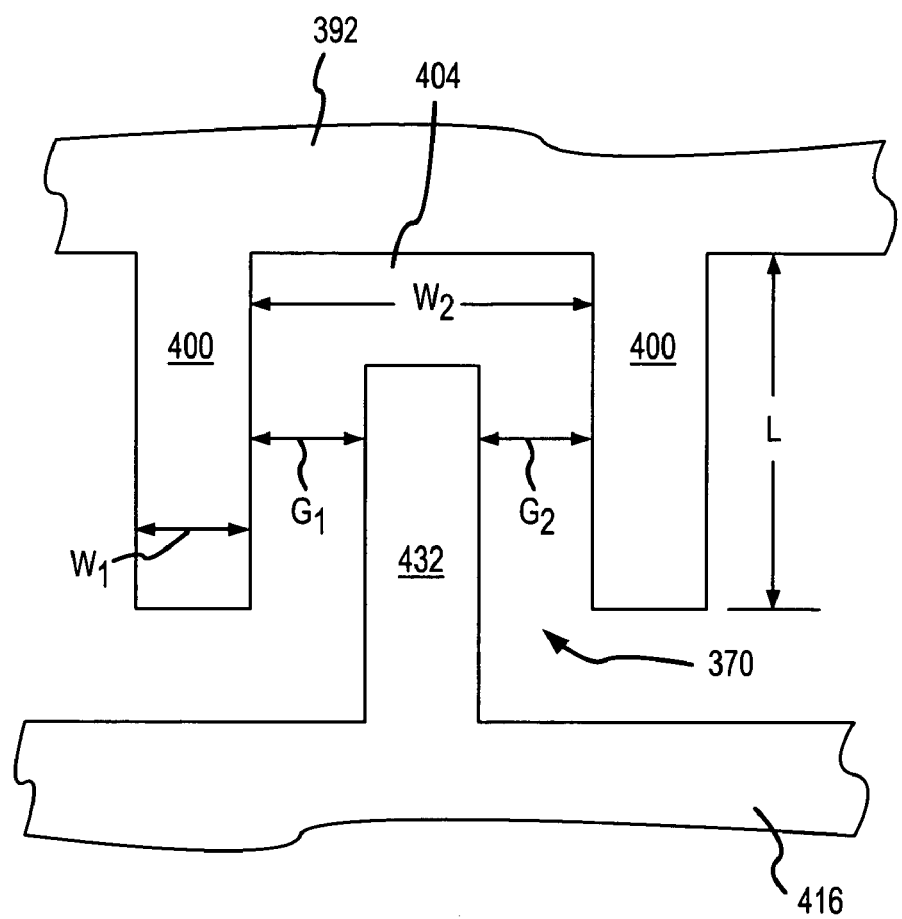
FIG. 11A is an enlarged top, plan view of one of the tuning element projections disposed between its corresponding pair of capacitor electrode projections on one of the capacitor electrodes.

An enlarged view of one of the above-noted "sub-capacitors" is illustrated in FIG. 11A and is identified by reference numeral 370. There it can be seen that one of the projections 432 of the tuning element 416 is preferably centrally disposed in the gap 404 between an adjacent pair of projections 400 of one of the capacitor electrodes 392. That is, the distance between the projection 432 of the tuning element 416 and one of the projections 400 of the capacitor electrode 392 (represented by dimension "$G_1$") is preferably the same as the distance between the projection 432 of the tuning element 416 and the other of the projections 400 of the capacitor electrode 392 (represented by dimension "$G_2$"). The end of the projection 432 of the tuning element 416 may also be spaced from the opposing portion of the capacitor electrode 392 by this same distance.

Although the various "dimensions" of the tunable capacitor 368 may be of any appropriate value, details regarding a specific configuration will be briefly addressed herein for an appreciation of the intricacy of the design (e.g., FIG. 11A). The tunable capacitor 368 may be operated with as little as a 10 volt or less differential between the pair of capacitor electrodes 392. The length of the projections 400 and 432 (dimension "L") may be on the order of about 20 $\mu$m. The value of the dimension $G_1$ and $G_2$ may be about 1.25 $\mu$m, and will typically be on the order of a few tenths of a micron to about 3 $\mu$m. The value of the dimension $W_1$ may be on the order of about 1.25 $\mu$m, and will typically be no more than about 5 $\mu$m.

Figure 11B:
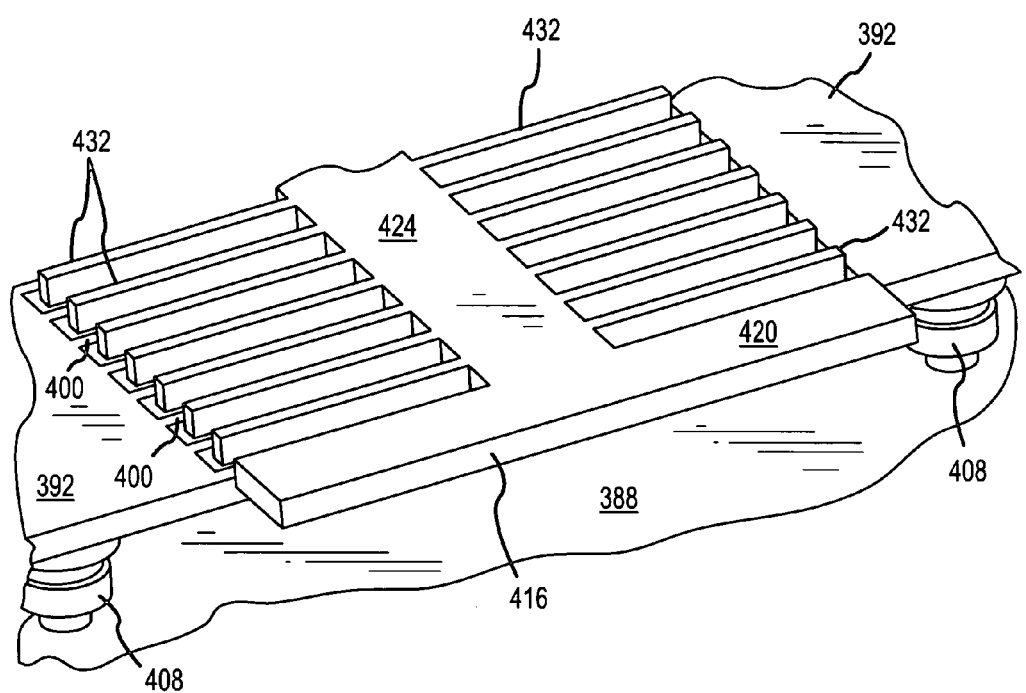
FIG. 11B is perspective view of the tuning element of FIGS. 9A–B in one position relative to the pair of stationary capacitor electrodes of FIGS. 8A–C.
Figure 11C:
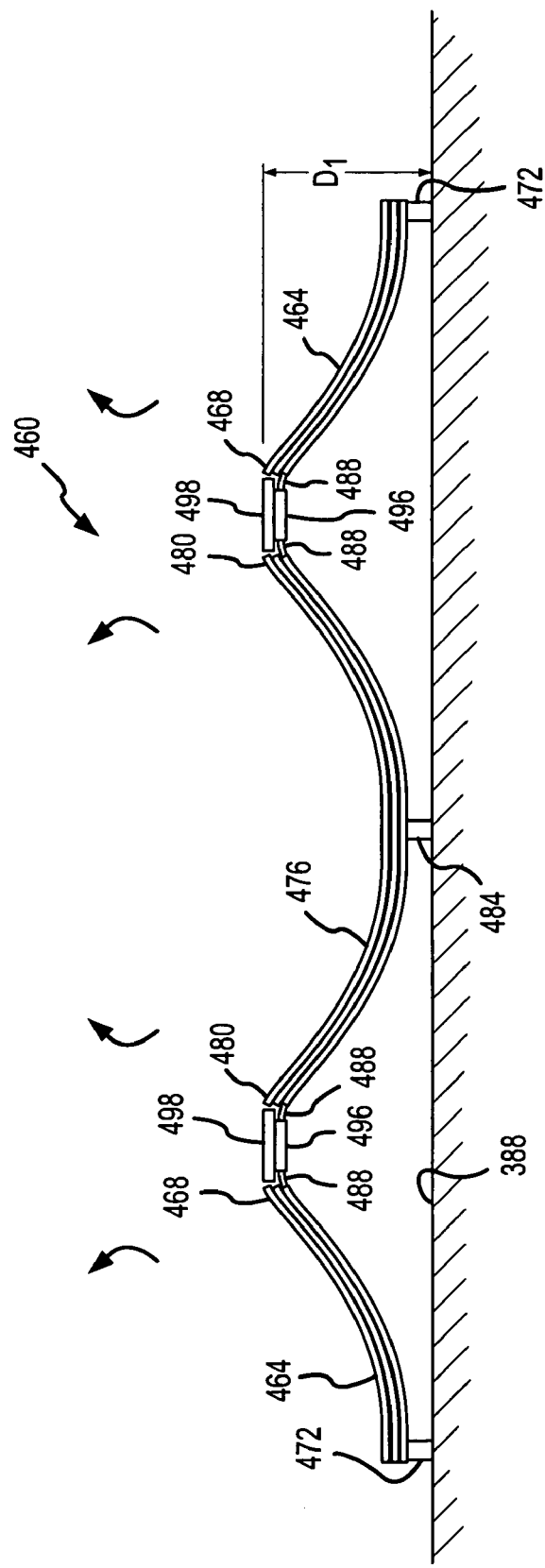
FIG. 11C is a side view of the elevation system of FIGS. 10A–C when disposing the tuning element in the position of FIG. 11B.

The position of the tuning element 416 relative to the pair of stationary capacitor electrodes 392 in the vertical dimension may be used to simultaneously change the capacitance of each of these individual capacitors 370, and thereby the total capacitance of the tunable capacitor 368. One position of the tuning element 416 is illustrated in FIG. 11B, and may correspond with a minimum capacitance configuration of the tunable capacitor 368. This may correspond with the zero bias position for the tunable capacitor 369, namely when no electrical signal is being provided to the conductor 412 on either capacitor electrode 392. At this time, the tuning element 416 may be disposed above the substrate 388 such that no portion of any of its projections 432 is disposed within the gap 404 between adjacent pairs of projections 400 associated with the capacitor electrodes 392 (e.g., no portion of a given projection 432 of the tuning element 416 extends down vertically into its corresponding gap 404 of the relevant capacitor electrode 392). This may correspond with a maximum vertical position of the elevation system 460, and which is illustrated in FIG. 11C. The lifters 464, 477 would then each be in contact with their corresponding travel limiter 500 at this time. However, the tuning element 416 could be slightly disposed within the gap 404 at this time as well (e.g., such that there is about a 0.25 $\mu$m overlap in the vertical dimension). Only one side of the elevation system 460 is illustrated in FIG. 11C, since the opposite side would be disposed in the same position. The free end 468 of each single action lifter 464 is disposed in its maximum vertical position in FIG. 11C, as are both free ends 480 of the dual action lifter 476. This will then dispose the tuning element 416 a certain distance above the substrate 388 that is represented by the dimension "$D_1$" in FIG. 11C.

Figure 11D:
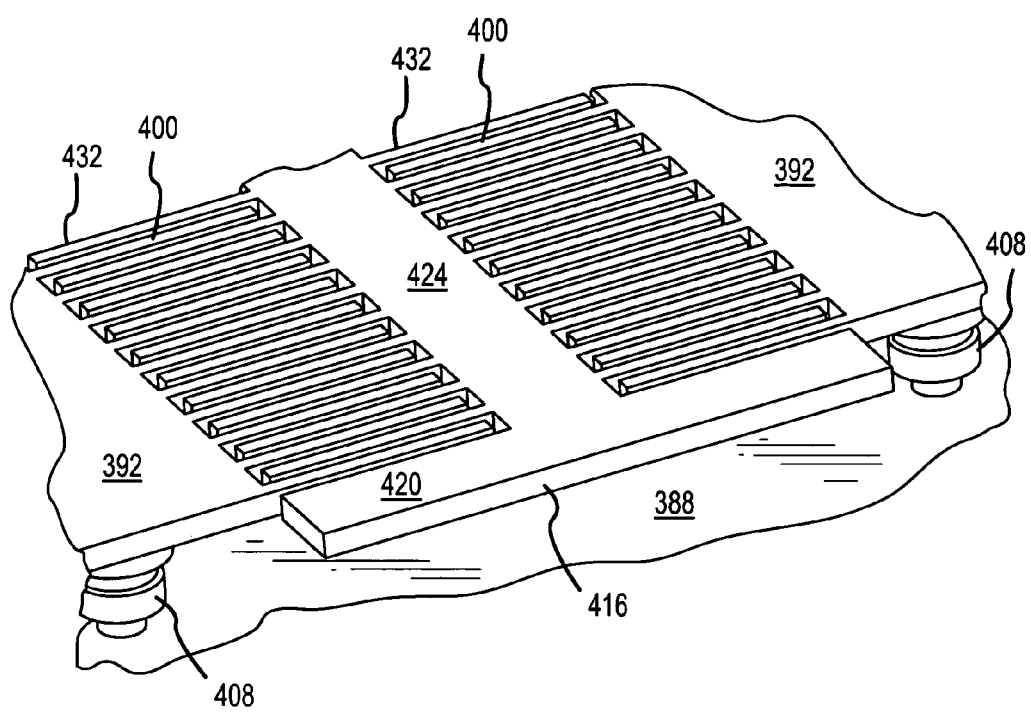
FIG. 11D is perspective view of the tuning element of FIGS. 9A–B in another position relative to the pair of stationary capacitor electrodes of FIGS. 8A–C.

Another position of the tuning element 416 is illustrated in FIG. 11D, which may correspond with a maximum capacitance configuration of the tunable capacitor 368. The tuning element 416 is disposed above the substrate 388 such that each of its projections 432 is disposed "more fully" within the gap 404 between adjacent projections 400 of the relevant capacitor electrode 392. At this time, the tuning element 416 may be at least generally coplanar with each of the capacitor electrodes 392. However, there may and typically will be a slight offset in the "fully engaged" position associated with maximum capacitance. The tuning element 416 may be moved in the vertical dimension to this position by applying an appropriate signal to the conductors 412 on each of the capacitor electrodes 392 (e.g., by applying an appropriate electrical bias). As noted above, the tuning element 416 may move in a number of manners to change capacitance. Movement of the tuning element 416 may be by a flexing of the suspension springs 492, changing the amount of flexure in the lifters 464, 476, or both. Preferably, the lifters 464, 476 remain in the FIG. 11C position, and movement of the tuning element 416 is at least primarily through flexing or deformation of the suspension springs 492. However, having the lifters 464, 476 move to change capacitance is also contemplated. In this regard, a change in the amount that the lifters 464, 476 are flexed is illustrated by a comparison of FIGS. 11C and 11E. In this case, the noted force has caused each of the lifters 464, 476 to flex in a manner that reduces the spacing between their corresponding free end 468, 480 and the substrate 388. Refer to FIG. 11E, which illustrates that the tuning element 416 is now disposed a distance above the substrate that is represented by dimension $D_2$. This distance (represented by dimension $D_2$)

is smaller than the distance represented by the dimension $D_1$ noted above in relation to FIG. 11C. FIG. 11C again may correspond with the FIG. 1B position, while FIG. 1E again may correspond with the FIG. 11D position.

The potential difference between the tuning element 416 and each of the capacitor electrodes 392 establishes the position of the tuning element 416 relative to the capacitor electrodes 392. This potential difference may be established or controlled in any appropriate manner. Typically both capacitor electrodes 392 will be coupled with a common voltage reference or bias (e.g., a common voltage source), although each could be coupled to its own. There are a number of options in relation to the tuning element 416 with regard to its potential. One is that the tuning element 416 may be "free floating" or not tied to any electrical potential at all. Another is that the tuning element 416 may be tied electrically to the substrate 388 or other ground. Yet another option would be to electrically tie the tuning element 416 to an external control or at least one of the capacitor electrodes 392, preferably through one or more resistors. This "external control" could be a voltage source. Preferably, the tuning element 416 is tied electrically to a high impedance external voltage reference or bias through a high impedance component(s) (e.g., resistors, inductors).

As noted above, the capacitor electrodes 392 and the tuning element 416 may be formed in the same structural layer by surface micromachining (the $P_4$ layer 372 in the illustrated embodiment). This is advantageous in that a single mask may be used to simultaneously define the capacitor electrodes 392 and the tuning element 416. The risk of the tuning element 416 being fabricated in misalignment with the capacitor electrodes 392 is thereby greatly reduced and possibly totally eliminated. The elevation system 460 accommodates forming the capacitor electrodes 392 and the tuning element 416 in the same structural layer as well. However, it may be possible to fabricate the tuning element 416 in a different structural level than the capacitor electrodes 392. This may alleviate the need for the pre-stressed lifters 464, 476.

During fabrication by surface micromachining, the capacitor electrodes 392 and the tuning element 416 may occupy the same vertical position in a stack of layers that are sequentially deposited/formed on the substrate 388 (the $P_4$ layer 372 in the illustrated embodiment). Once the tunable capacitor 368 is released (e.g., exposed to an appropriate etchant to remove all or at least a portion of the layers of sacrificial material that exist between each of the vertically spaced, structural layers in the stack (e.g., to remove the sacrificial layer between the $P_4$ layer 372 and the $P_3$ layer 376, to remove the sacrificial layer under the $P_3$ layer 376 and the $P_2$ layer 380), the elevation system 460 and its various pre-stressed lifters 464, 476 will lift the tuning element 416 (i.e., increase the spacing between the tuning element 416 and the substrate 388 in the vertical dimension) to a position established by the plurality of travel limiters 500. This will thereby dispose the tuning element 416 at a different elevation relative to the substrate 388 in the vertical dimension than the pair of capacitor electrodes 392, which are again disposed at a common elevation relative to the substrate 388 in the vertical dimension.

The preferred fabrication technique for the tunable capacitor 368 is surface micromachining. Surface micromachining generally entails depositing alternate layers of structural material and sacrificial material using an appropriate substrate (e.g., a silicon wafer) which functions as the foundation for the resulting microstructure. Various patterning operations (collectively including masking, etching, and mask removal operations) may be executed on one or more of these layers before the next layer is deposited so as to define the desired microstructure. After the microstructure has been defined in this general manner, all or a portion of the various sacrificial layers are removed by exposing the microstructure and the various sacrificial layers to one or more etchants. This is commonly called "releasing" the microstructure from the substrate, typically to allow at least some degree of relative movement between the microstructure and the substrate.

The term "sacrificial layer" as used herein means any layer or portion thereof of any surface micromachined microstructure that is used to fabricate the microstructure, but which does not exist in the final configuration. Exemplary materials for the sacrificial layers described herein include undoped silicon dioxide or silicon oxide, and doped silicon dioxide or silicon oxide ("doped" indicating that additional elemental materials are added to the film during or after deposition). The term "structural layer" as used herein means any other layer or portion thereof of a surface micromachined microstructure other than a sacrificial layer and a substrate on which the microstructure is being fabricated. Exemplary materials for the structural layers described herein include doped or undoped polysilicon and doped or undoped silicon. Exemplary materials for the substrates described herein include silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD) and including evaporative PVD and sputtering PVD, as examples.

In more general terms, surface micromachining can be done with any suitable system of a substrate, sacrificial film(s) or layer(s) and structural film(s) or layer(s). Many substrate materials may be used in surface micromachining operations, although the tendency is to use silicon wafers because of their ubiquitous presence and availability. The substrate is essentially a foundation on which the microstructures are fabricated. This foundation material must be stable to the processes that are being used to define the microstructure(s) and cannot adversely affect the processing of the sacrificial/structural films that are being used to define the microstructure(s). With regard to the sacrificial and structural films, the primary differentiating factor is a selectivity difference between the sacrificial and structural films to the desired/required release etchant(s). This selectivity ratio may be on the order of about 10:1, and is more preferably several hundred to one or much greater, with an infinite selectivity ratio being most preferred. Examples of such a sacrificial film/structural film system include: various silicon oxides/various forms of silicon; poly germanium/poly germanium-silicon; various polymeric films/various metal films (e.g., photoresist/aluminum); various metals/various metals (e.g., aluminum/nickel); polysilicon/silicon carbide; silicone dioxide/polysilicon (i.e., using a different release etchant like potassium hydroxide, for example). Examples of release etchants for silicon dioxide and silicon oxide sacrificial materials are typically hydrofluoric (HF) acid based (e.g., undiluted or concentrated HF acid, which is actually 49 wt % HF acid and 51 wt % water; concentrated HF acid with water; buffered HF acid (HF acid and ammonium fluoride)).

FIGS. 12A–M illustrate one way by which the capacitor electrodes 392 and the tuning element 416 may be fabricated from the same structural layer by surface micromachining.

Figure 12A:
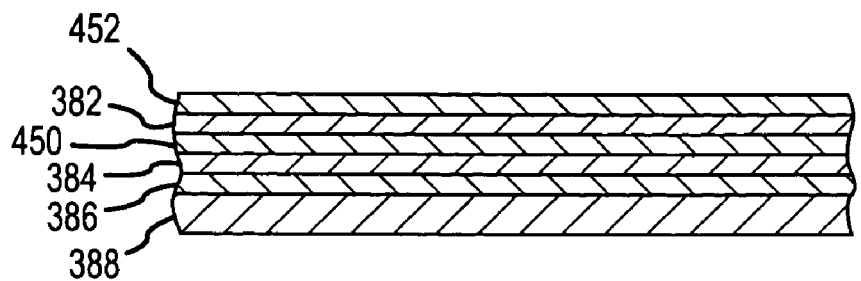
Figure 12B:
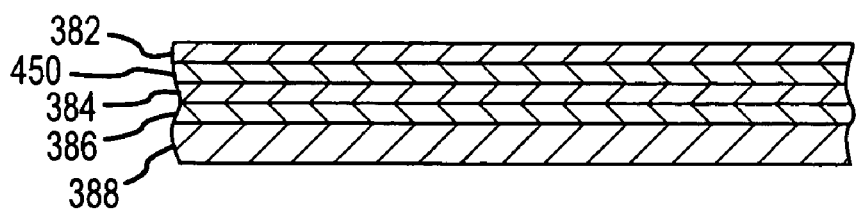
Figure 12C:
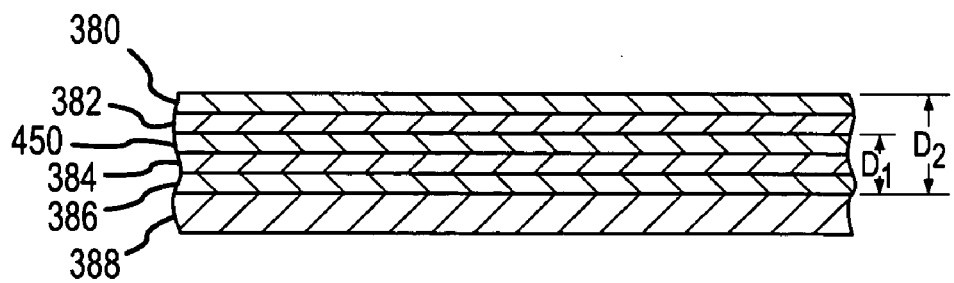

All structural layers are identified by the letter "P" with an appropriate subscript, while all sacrificial layers are identified by the letter "S" with an appropriate subscript. A plurality of layers are sequentially deposited or formed on the substrate 388. Referring to FIG. 12A: 1) a dielectric layer 386 is formed on the upper surface of the substrate 388 (which may include an oxide layer); 2) a $P_0$ layer 384 is thereafter formed on the upper surface of the dielectric layer 386 and is typically patterned to define a ground plane used by the tunable capacitor 368 (the dielectric layer 386 thereby isolating the $P_0$ layer 384 from the substrate 388; 3) a $S_1$ layer 450 is thereafter formed on the upper surface of the $P_0$ layer 384; 4) a $P_1$ layer 382 is thereafter formed on the upper surface of the $S_1$ layer 450; and 5) a $S_2$ layer 452 is thereafter formed on an upper surface of the $P_1$ layer 382. The portion of the $S_2$ layer 452 that would be disposed under the area to be collectively defined by the capacitor electrodes 392 and tuning element 416 is then patterned to expose the underlying $P_1$ layer 382 as illustrated in FIG. 12B. A $P_2$ layer 380 is thereafter formed on an upper surface of the $P_1$ layer 382 and attaches thereto as illustrated in FIG. 12C. Although FIG. 12C illustrates a demarcation between the $P_2$ layer 380 and the $P_1$ layer 382, such would actually appear to be homogenous. The upper surface of the $S_1$ layer 450 is disposed a distance $D_1$ from the upper surface of the substrate 388, while the upper surface of the $P_2$ layer 380 is disposed a distance $D_2$ from the upper surface of the substrate 388 and is also illustrated in FIG. 12C.

Figure 12D:
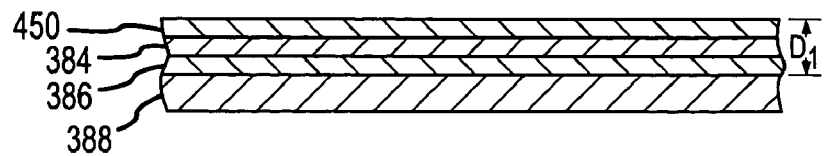
Figure 12E:
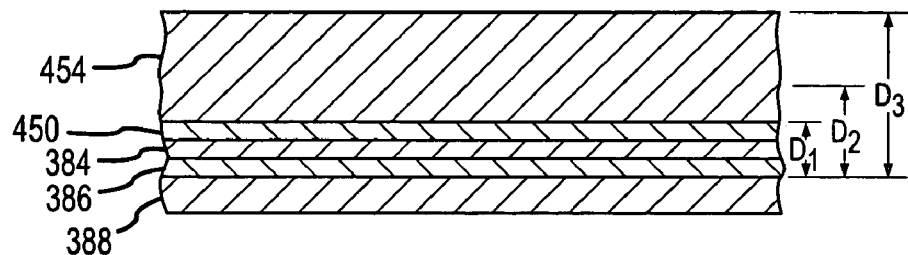
Figure 12F:
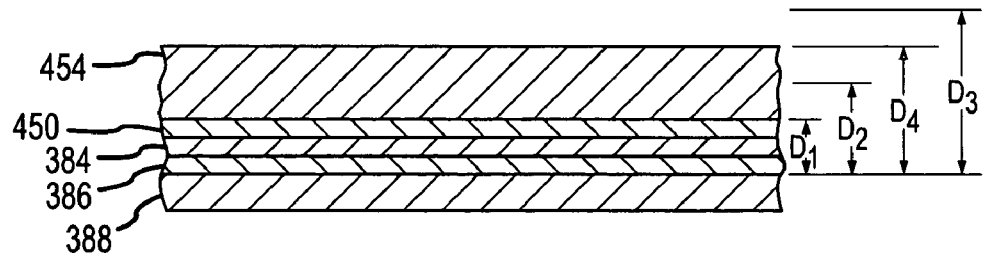

The portion of the $P_2$ layer 380 and $P_1$ layer 382 that would be disposed under the area collectively defined by the capacitor electrodes 392 and tuning element 416 is then patterned to expose the underlying $S_1$ layer 450 as illustrated in FIG. 12D. A $S_3$ layer 454 is thereafter formed on the upper surface of the $S_1$ layer 450 as illustrated in FIG. 12E. Although FIG. 12E illustrates a demarcation between the $S_3$ layer 454 and the $S_1$ layer 450, such would actually appear to be homogenous. The upper surface of the $S_3$ layer 454 under the area to be collectively defined by the capacitor electrodes 392 and tuning element 416 is disposed a distance $D_3$ above the upper surface of the substrate 388. Other portions of the upper surface of the $S_3$ layer 454 that are deposited on the upper surface of the $P_2$ layer 380 at other locations on the substrate 388 may be disposed a different distance from the upper surface of the substrate 388. Since the $S_3$ layer 454 is thicker than both the $S_1$ layer 450 and the $S_2$ layer 452 after its initial formation, the upper surface of the $S_3$ layer 454 may be planarized (e.g., by chemical mechanical polishing) and as illustrated in FIG. 12F. This disposes its upper surface at a substantially common elevation above the substrate 388 across the entire extent of the substrate 388 (represented by a distance $D_4$, that is less than the distance $D_3$).

Figure 12G:
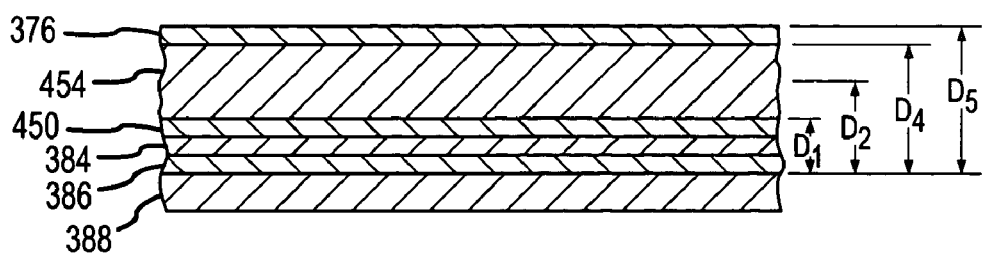
Figure 12H:
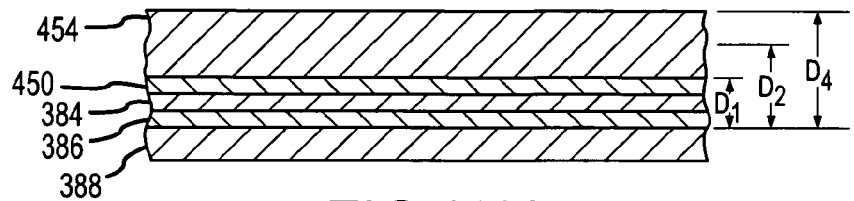
Figure 12I:
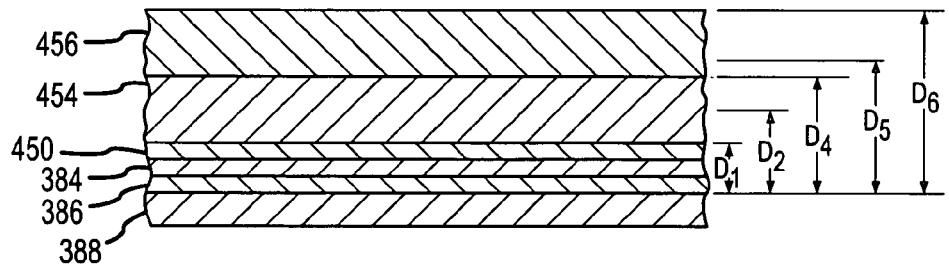
Figure 12J:
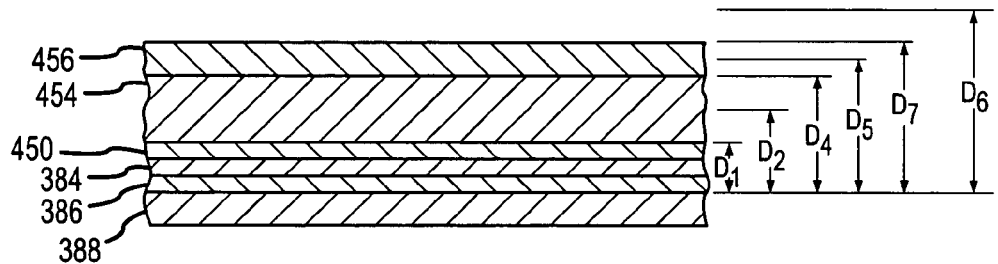

A $P_3$ layer 376 is thereafter formed on the now planarized upper surface of the $S_3$ layer 454 as illustrated in FIG. 12G. The portion of the $P_3$ layer 376 that would be disposed under the area to be collectively defined by the capacitor electrodes 392 and tuning element 416 is then patterned to expose the underlying $S_3$ layer 454 as illustrated in FIG. 12H. A $S_4$ layer 456 is thereafter formed on the upper surface of the $S_3$ layer 454 as illustrated in FIG. 12I. Although FIG. 12I illustrates a demarcation between the $S_4$ layer 456 and the $S_3$ layer 454, such would actually appear to be homogeneous. The upper surface of the $S_4$ layer 456 under the area to be collectively defined by the capacitor electrodes 392 and tuning element 416 is disposed a distance $D_6$ above the upper surface of the substrate 388. Other portions of the upper surface of the $S_4$ layer 456 that are deposited on the upper surface of the $P_3$ layer 376 at other locations of the substrate 388 may be disposed a different distance from the upper surface of the substrate 388. Since the $S_4$ layer 456 is thicker than both the $S_1$ layer 450 and the $S_2$ layer 452 after its initial formation, the upper surface of the $S_4$ layer 456 may be planarized (e.g., by chemical mechanical polishing) and as illustrated in FIG. 12J. This disposes its upper surface at a substantially common elevation above the substrate 388 across the entire extent of the substrate 388 (represented by a distance $D_7$, that is less than the distance $D_6$).

Figure 12K:
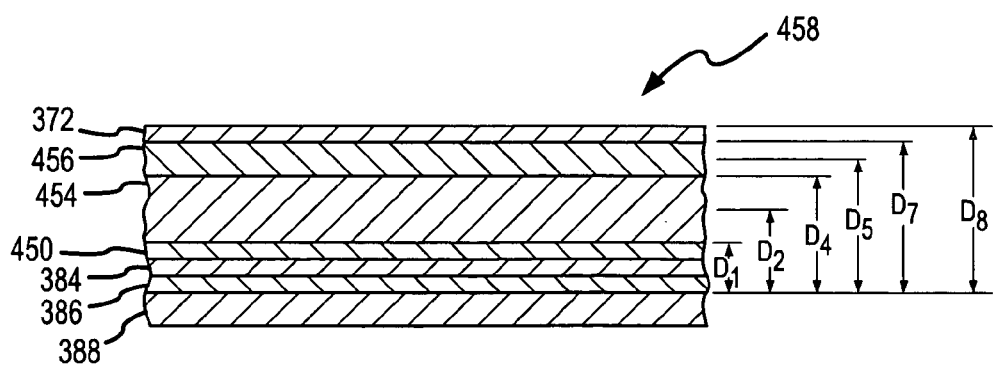
Figure 12L:
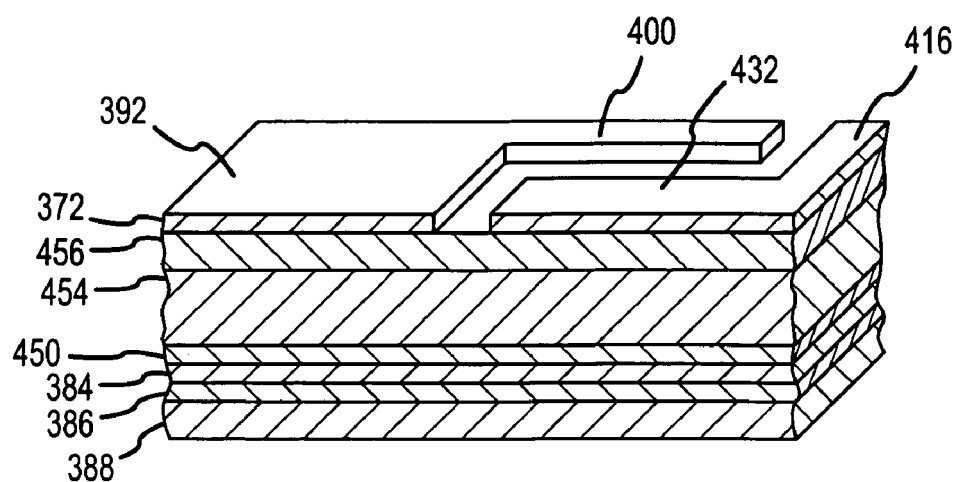
Figure 12M:
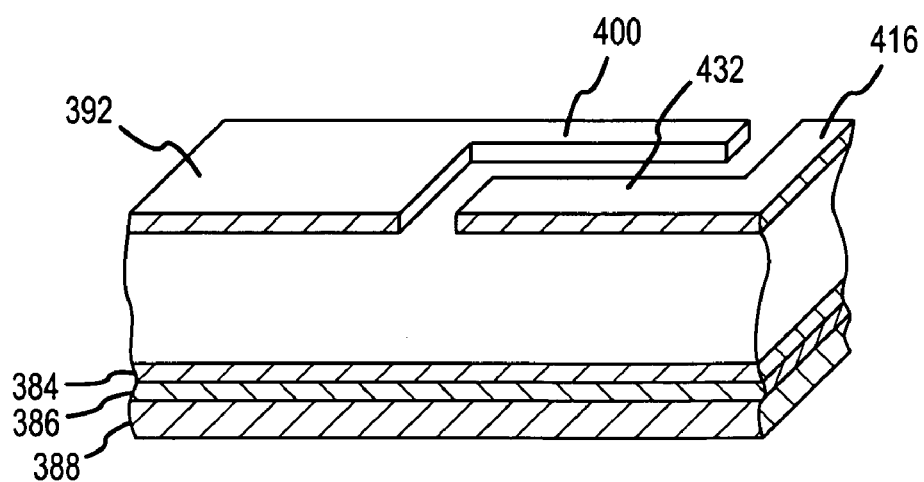

A $P_4$ layer 372 is thereafter formed on the now planarized upper surface of the $S_4$ layer 456 as illustrated in FIG. 12K, which completes the definition of a surface micromachined stack 458. The $P_4$ layer 372 is disposed a distance $D_8$ above the upper surface of the substrate 388. The $P_4$ layer 372 is then patterned to define the capacitor electrodes 392 and tuning element 416 and as illustrated in FIG. 12L. Prior to the release etch, the tuning element 416 and both capacitor electrodes 392 will thereby be disposed the same distance $D_8$ above the upper surface of the substrate 388. At this time, the conductors 412 may be deposited on each of the capacitor electrodes 392 while the stack 458 is intact. Thereafter, the stack 458 is exposed to an appropriate etchant to remove the $S_1$, $S_3$, and $S_4$ layers as illustrated in FIG. 12M so as to release the tunable capacitor 368. This disposes the capacitor electrodes 392 and the tuning element 416 in spaced relation to the substrate 388 in the vertical dimension. After the release, the pre-stressed condition of the elevation system 460 will thereafter increase the spacing between the tuning element 416 and the substrate 388 (e.g., FIG. 11B).

Values for the thickness of the above-noted layers will be provided herein solely for reference purposes, and not by way of limitation: $P_4$ layer 372 (about 2 $\mu$m); $S_4$ layer 456 (about 2 $\mu$m after planarization); $P_3$ layer 376 (about 2.25 $\mu$m); $S_3$ layer 454 (about 2 $\mu$m after planarization); $P_2$ layer 380 (about 1.5 $\mu$m); $S_2$ layer 452 (about 0.3 $\mu$m); $P_1$ layer 382 (about 1 $\mu$m); $S_1$ layer (about 2 $\mu$m); $P_0$ layer 384 (about 0.3 $\mu$m); and dielectric layer 386 (about 0.8 $\mu$m).

A plurality of tunable capacitors of the type discussed above in relation to FIGS. 7A–B may in effect be appropriately interconnected and/or integrated to define a larger capacitor or capacitive structure. FIG. 13A illustrates one such arrangement in the form of what may be characterized as a capacitor array 512. The capacitor array 512 includes at least one, and more typically a plurality of rows 516 (five in the illustrated embodiment). Any appropriate number of rows 516 could be utilized. Each row 516 has at least one, and more typically a plurality, of axially aligned tuning elements 416 (only schematically illustrated, but may include the plurality of projections 432 discussed above). Any appropriate number of tuning elements 416 could be utilized in each row 516. Although the tuning elements 416 in a given row 516 could be independently movable in the vertical dimension (e.g., each tuning element 416 in a given row 516 being interconnected with its own elevation system 460), in the illustrated embodiment the tuning elements 416 in each row 516 are actually structurally interconnected or "hooked together" in end-to-end relation such that all tuning elements 416 in each row 516 collectively move together as a single unit. Preferably, tuning elements 416 disposed in different rows 516 are disposed in parallel relation as illustrated.

Each tuning element 416 is interconnected with an elevation system 528 (generally of the type discussed above in relation to the tunable capacitor 368 of FIGS. 7A–B) by suspension springs 492. Any of the elevation systems disclosed herein could be used by the capacitor array 512 and in any manner. For instance, the type of elevation system 178 discussed above in relation to FIG. 4B for each row 516, or for each individual tuning element 416 in a given row 516, may be utilized by the array 512 (e.g., such that suspension springs 492 extend from the ends of each row 516 to further stabilize the corresponding row 516/tuning element 416). Another option would be to use one of the lifter assemblies 258 discussed above in relation to FIGS. 5A–B on each end of each row 516 (i.e., any combination of the various elevation systems disclosed herein may be utilized as well in relation to the array 512).

The elevation system 528 includes a plurality of individual sections 529. Preferably, the sections 529 of the elevation system 528 are disposed in parallel relation. In any case, each such section 529 of the elevation system 528 includes three dual action lifters 476 and a pair of single action lifters 464 at its two opposite ends. The number of dual action lifters 476 that are used by the array 512 may equal the number of tuning elements 416 in each row 516. Those sections 529 of the elevation system 528 that are located between the top and bottom rows 516 of the array 512 in the view presented in FIG. 13A act on tuning elements 416 in two rows 516 (via the corresponding suspension springs 492 as shown). That is, at least some of the sections 529 of the elevation system 528 act on suspension springs 492 interconnected with different tuning elements 416 in different rows 516. Multiple sections 529 could be disposed between adjacent pairs of rows 516 so that each section 529 of the elevation system 528 acted on only those tuning elements 416 utilized by a given row 516 (not shown).

The array 512 includes two capacitor electrodes 520, 524 that are appropriately distributed throughout the array 512 and that are only schematically illustrated in FIG. 13A. That is, each such capacitor electrode 520, 524 may include a plurality of the projections 400 discussed above for interacting with the projections 432 of the corresponding tuning element(s) 416. A separate conductor would preferably be formed on both capacitor electrodes 520, 524 (not shown) in the manner discussed above in relation to the embodiment of FIGS. 7A–B (e.g., a separate conductor 412 would be disposed on each capacitor electrode 520, 524, but would not be disposed or extend over any of the associated projections 432).

A separate electrical lead (not shown) is appropriately electrically interconnected with each capacitor electrode 520, 524 (again, preferably via a conductor having a smaller resistance in the manner discussed above in relation to the embodiment of FIGS. 7A–B). Capacitor electrode 520 includes a segment 521 disposed on one side of the array 512 and a plurality of segments 522 that extend from segment 521 in parallel relation and whose ends are disposed in spaced relation to the aligned portion of the capacitor 524 on the opposite side of the array 512. The plurality of projections 432 are included on each segment 522 for interacting with the adjacent tuning element(s) 416. Segments 522 are disposed on opposite sides of the tuning elements 416 in adjacent rows 516.

Capacitor electrode 524 includes a segment 525 disposed on the opposite side of the array 512 (from capacitor electrode 520, specifically is segment 521) and a plurality of segments 526 that extend from segment 525 in parallel relation and whose ends are disposed in spaced relation to the aligned portion of the capacitor 520 on the opposite side of the array 512. The plurality of projections 432 are included on each segment 526 for interacting with the adjacent tuning element(s) 416. Segments 526 are disposed on opposite sides of the tuning elements 416 in adjacent rows 516. Segments 521 of capacitor electrode 520 are spaced from segment 525 of capacitor electrode 524. Similarly, segments 526 of capacitor electrode 524 are spaced from segment 521 of capacitor electrode 520.

The segments 522 and 526 are distributed throughout the array 512 such that one segment 522 and one segment 526 are associated with each row 516. In addition, note that the segments 522 alternate in relation to which side they are disposed amongst the rows 516, as do the segments 526. That is and for the view presented in FIG. 13A, a given segment 522 extends along one side of the tuning elements 416 in one row 516, while the adjacentmost segment 522 extends along the opposite side of the tuning elements 416 in a different row 516.

Although the various tuning elements 416 in the capacitor array 512 are being electrostatically biased by the same pair of capacitor electrodes 520, 524, the vertical position of each such tuning element 416 need not necessarily be the same. That is, each tuning element 416 of the capacitor array 512 need not (but may) respond differently to the same electrical bias on the capacitor electrodes 520, 524. For instance, a given tuning element 416 may use suspension springs 492 of a different stiffness than those suspension springs 492 of another tuning element 416. One implementation would be for the tuning elements 416 in each row 516 to use suspension springs 492 of the same stiffness, and for at least two rows 516 in the array 512 to use suspension springs 492 of different stiffnesses (including where each row 516 uses suspension springs 492 of different stiffnesses). Another implementation would be for at least two independently movable tuning elements 416 in a given row 516 to use suspension springs 492 of different stiffnesses, and including where each tuning element 416 in a given row 516 uses suspension springs 492 of different stiffnesses compared to all other tuning elements 416 in the row 516.

Another way to change the response of the various tuning elements 416 would be to use at least two different capacitive gaps throughout the array 512 (e.g., different spacings between a projection 400 on the segments 522, 526 of the capacitor electrodes 520, 524 and a corresponding projection 432 of a tuning element 416, and corresponding with either of dimension $G_1$ or dimension $G_2$ in FIG. 11A). One implementation would be for the tuning elements 416 in each row 516 to interact with a common capacitive gap on corresponding segments 522, 526 of the capacitor electrodes 520, 524, and for the corresponding segments 522, 526 of the capacitor electrodes 520, 524 to use different capacitive gaps for at least two rows 516 (including where a different capacitive gap is used in relation to each of the segments 522, 526 of the capacitor electrodes 520, 524). Another implementation would be for at least two independently movable tuning elements 416 in a given row 516 to interact with a different capacitive gap on the same segment 522/526 of the corresponding capacitor electrode 520/524, and including where each tuning element 416 in a given row 516 interacts with a different capacitive gap on the same segment 522/526 of the corresponding capacitor electrode 520/524.

It should be appreciated that combinations of the foregoing (varying both the stiffness of the suspension springs 492 and the capacitive gap between the interacting portions of the tuning elements 416 and the corresponding segment 522, 526 of the corresponding capacitor electrode 520, 524) may be used as well in relation to the response of the various tuning elements 416. It should also be appreciated that the elevation system 528 may need to be adapted to implement this type of tailoring of the response of the various tuning elements 416. Tuning elements 416 that differed in relation to one or both of the stiffness of the suspension springs 492 or the capacitive gap would likely not be interconnected with a common section 529 of the elevation system 528.

Another embodiment where a plurality of tunable capacitors of the type discussed above in relation to FIGS. 7A–B may in effect be appropriately interconnected to define a larger capacitor or capacitive structure is illustrated in FIGS. 13B–C and is identified as a capacitor array 590. The capacitor array 590 includes a plurality of tuning elements 594 at least generally in accordance with the configuration of FIGS. 7A–B. Any appropriate number of tuning elements 594 could be utilized by the capacitor array 590. The various tuning elements 594 are disposed in parallel in the illustrated embodiment, although other arrangements may be appropriate. Each tuning element 594 is structurally interconnected with each adjacent tuning element 594 such that all to the elements 594 in the capacitor array 590 move together and in the same general manner. Any appropriate way of structurally interconnecting adjacent tuning elements 594 may be utilized. In the illustrated embodiment, this structural interconnection is provided at each of the two ends of the tuning elements 594 by a structural interconnect 596.

The capacitor array 590 includes two capacitor electrodes 598, 612 that are appropriately distributed throughout the array 590 and that are only schematically illustrated in FIG. 13A. That is, each capacitor electrode 590, 612 may include a plurality of the projections of the type discussed above for interacting with the projections of the corresponding tuning element(s) 598. The capacitor electrodes 598, 612 may be formed from a material that is sufficiently electrically conductive, or may be formed from a more electrically resistive material with a more electrically conductive material formed thereon in the same general manner as discussed above. In the illustrated embodiment, the structural interconnects 596 between adjacent tuning elements 594 are disposed in vertically spaced relation to the capacitor electrodes 598, 612. Although the capacitor electrodes 598, 612 are disposed over the structural interconnects 596 in the illustrated embodiment, the reverse could be utilized as well. Any way of establishing electrical contact with the capacitor electrodes 598, 612 may be utilized. What is of importance is that there is a variable potential difference between the tuning elements 416 and each of the capacitor electrodes 598, 612 to as to be able to vary the capacitance.

Capacitor electrode 598 includes a segment 602 disposed on one side of the array 590 and a plurality of segments 606 that extend from segment 602 in parallel relation and whose ends are disposed in spaced relation to the aligned portion of the capacitor electrode 612 on the opposite side of the array 590. A plurality of projections may be included on each side of each segment 606 for interacting with the adjacent tuning element(s) 594. Segments 606 are disposed on opposite sides of each adjacent pair of tuning elements 594.

Capacitor electrode 612 includes a segment 616 disposed on one side of the array 590 and a plurality of segments 620 that extend from segment 616 in parallel relation and whose ends are disposed in spaced relation to the aligned portion of the capacitor electrode 598 on the opposite side of the array 590. A plurality of projections may be included on each side of each segment 616 for interacting with the adjacent tuning element(s) 594. Segments 620 are disposed on opposite sides of each adjacent pair of tuning elements 594.

The segments 606 of capacitor electrode 598 and the segments 620 of capacitor electrode 612 are disposed in alternating relation throughout the array 590. Except for those segments 606, 620 disposed at either of the two extremes of the array 590, each segment 606, 620 interacts with a pair of tuning elements 594 (e.g., at least one tuning element 594 in each row of the array 590). Each tuning element 594 has a segment 606 and a segment 620 extending along each of its two sides.

A plurality of suspension springs 624 are interconnected with the capacitor array 590 to allow the various structurally interconnected tuning elements 594 to collectively move relative to the stationary capacitor electrodes 598, 612 to change the capacitance. Rigid mounts 622 associated with the capacitor array 590 extend under the segments 602, 616 and interconnect with a suspension spring 624. The suspension springs 624 may be interconnected with the capacitor array 590 in any appropriate manner. Any number of suspension springs 624 may be utilized, any appropriate configuration may be used for the suspension springs 624, and the suspension springs 624 may be disposed in any appropriate orientation or arrangement. For instance, the plurality of suspension springs 624 may be symmetrically disposed relative to the capacitor array 590, although asymmetrical arrangements could be utilized as well. In any case, one end of each suspension spring 624 is appropriately interconnected with the capacitor array 590. The opposite end of each suspension spring 624 may be interconnected with a stationary structure that is anchored to the substrate on which the capacitor array 590 is fabricated. Another option would be for the opposite end of each suspension spring 624 to be interconnected with an elevation system (e.g., a pre-stressed lifter(s) of the type discussed above). Any such elevation system may be disposed beyond the perimeter of the capacitor array 590. In the illustrated embodiment, the suspension springs 624 are disposed in vertically spaced relation to the capacitor electrodes 598, 612. Although the capacitor electrodes 598, 612 are disposed over the suspension springs 624 in the illustrated embodiment, the reverse could be utilized as well.

Another embodiment of a tunable capacitor is illustrated in FIGS. 14A–B and is identified by reference numeral 530. The tunable capacitor 530 is fabricated on/from a substrate 534 that is suitable for surface micromachining and that is the ultimate supporting structure of the resulting tunable capacitor 530. Fundamental components of the tunable capacitor 530 include a first capacitor electrode 538, a second capacitor electrode 554, and a tuning element 570. The first capacitor electrode 538, the second capacitor electrode 554, and tuning element 570 each may be of any appropriate configuration and formed from any appropriate material or combination of materials.

The first capacitor electrode 538 and the second capacitor electrode 554 are appropriately supported above the substrate 534 in a fixed/stationary position. A first conductor 542 is disposed on an upper surface of the first capacitor electrode 538, while a second conductor 558 is disposed on an upper surface of the second capacitor electrode 554. The electrical resistance of the first conductor 542 is preferably substantially less than the electrical resistance of the first capacitor electrode 538, and the electrical resistance of the second conductor 558 is preferably substantially less than the electrical resistance of the second capacitor electrode 554. In one embodiment, the first capacitor electrode 538 and the second capacitor electrode 554 are polysilicon, and the first conductor 542 and second conductor 558 are an appropriate metal such as gold. This configuration may provide a tunable capacitor 530 with a high Q or Q-factor (high quality) that may be fabricated by surface micromachining.

A first electrical terminal 546 is electrically interconnected with the first conductor 542 by a first electrical lead 550. Similarly, a second electrical terminal 562 is electrically interconnected with the second conductor 558 by a second electrical lead 566. The electrical terminals 546, 562 are associated with a source for generating/maintaining an electrical bias between the movable tuning element 570 of the tunable capacitor 530 and at least one of the first capacitor electrode 538 and the second capacitor electrode 554 (e.g., a single voltage source).

The first capacitor electrode 538 and the second capacitor electrode 554 may be characterized as being coplanar. Stated another way, the first capacitor electrode 538 and the second capacitor electrode 554 are disposed a common distance above the substrate 534 in the vertical dimension (orthogonal to the substrate 534, and represented by dimension "D" in FIG. 14A). The first capacitor electrode 538 and the second capacitor electrode 554 are also spaced in a lateral or horizontal dimension that is orthogonal to the vertical dimension (parallel with the substrate 534).

The tuning element 570 is movable relative to the first capacitor electrode 538 and the second capacitor electrode 554 in response a change in the electrical bias of the first and second capacitor electrodes 538, 554 via the first and second electrical terminals 546, 562. Generally, the tuning element 570 is able to move about an axis 578 to change the capacitance of the tunable capacitor 530. In the illustrated embodiment the tuning element 570 is suspended from the first capacitor electrode 538 and by a suspension element 574. Other ways of interconnecting the tuning element 570 with the substrate 534 so as to be able to move about axis 578 may be utilized. FIG. 14A illustrates the tuning element 570 in one position relative to the first capacitor electrode 538 and the second capacitor electrode 554 (e.g., a zero bias position, and minimum capacitance). FIG. 14B illustrates the tuning element 570 in another position relative to the first capacitor electrode 530 and the second capacitor electrode 554 by movement about the axis 578 (e.g., a maximum capacitance position). The movement of the tuning element 570 about the axis 578 may be produced by the electrical signal provided to the first capacitor electrode 538 and the second capacitor electrode 554 (e.g., exerting an electrostatic force on the tuning element 570 to move the tuning element 570 about the axis 578 to a desired position, and to thereafter retain the tuning element 570 in this position). It may be desirable to somehow limit the amount that the tuning element 570 may move about the axis 578 toward the second capacitor electrode 554.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A tunable capacitor, comprising:
a substrate;
a first capacitor electrode spaced above said substrate a first distance in a first dimension, wherein said first capacitor electrode is maintained in a fixed position relative to said substrate;
a second capacitor electrode spaced above said substrate said first distance in said first dimension, wherein said second capacitor electrode is maintained in a fixed position relative to said substrate, wherein said first and second capacitor electrodes are coplanar and are spaced in a second dimension that is orthogonal to said first dimension; and
a tuning element in a position in said second dimension that is between a position of said first capacitor electrode in said second dimension and a position of said second capacitor electrode in said second dimension, and further that is movable in said first dimension.

2. A tunable capacitor, as claimed in claim 1, wherein:
said substrate has a low resistivity.

3. A tunable capacitor, as claimed in claim 1, further comprising:
a first conductor disposed on said first capacitor electrode and a second conductor disposed on said second capacitor electrode.

4. A tunable capacitor, as claimed in claim 3, wherein:
said first conductor and said first capacitor electrode are formed from different materials, and wherein said second conductor and said second capacitor electrode are formed from different materials.

5. A tunable capacitor, as claimed in claim 4, wherein:
said first and second capacitor electrodes are formed from a common material, and wherein said first and second conductors are formed from a common material.

6. A tunable capacitor, as claimed in claim 3, wherein:
said first and second capacitor electrodes are each polysilicon, and wherein said first and second conductors are each metal.

7. A tunable capacitor, as claimed in claim 6, wherein:
said first and second conductors are gold.

8. A tunable capacitor, as claimed in claim 3, further comprising:
a first electrical lead attached to said first conductor and a second electrical lead attached to said second conductor.

9. A tunable capacitor, as claimed in claim 3, wherein:
a resistance of said first conductor is less than a resistance of said first capacitor electrode, and a resistance of said second conductor is less than a resistance of said second capacitor electrode.

10. A tunable capacitor, as claimed in claim 3, wherein:
said first conductor is disposed on an upper surface of said first capacitor electrode and said second conductor is disposed on an upper surface of said second capacitor electrode.

11. A tunable capacitor, as claimed in claim 3, wherein:
said first capacitor electrode comprises a first edge, wherein said first edge of said first capacitor electrode comprises a plurality of first projections spaced along said first edge of said first capacitor electrode;
said second capacitor electrode comprises a second edge that faces said first edge of said first capacitor electrode, wherein said second edge of said second capacitor electrode comprises a plurality of second projections spaced along said second edge of said second capacitor electrode;

said tuning element comprises a plurality a third projections disposed along a first edge of said tuning element, wherein each said third projection is aligned in said first dimension with a space between an adjacent pair of said first projections of said first capacitor electrode;

said tuning element comprises a plurality of fourth projections disposed along a second edge of said tuning element, wherein each said fourth projection is aligned in said first dimension with a space between an adjacent pair of said second projections of said second capacitor electrode;

said first conductor fails to extend over any of said first projections of said first capacitor electrode; and said second conductor fails to extend over any of said second projections of said second capacitor electrode.

12. A tunable capacitor, as claimed in claim 1, further comprising:

a plurality of first posts anchored to each of said substrate and said first capacitor electrode, and a plurality of second posts anchored to each of said substrate and said second capacitor electrode.

13. A tunable capacitor, as claimed in claim 1, made by the process of:

fabricating said first and second capacitor electrodes from a common structural layer by surface micromachining.

14. A tunable capacitor, as claimed in claim 1, made by the process of:

fabricating said tuning element and said first and second capacitor electrodes from a common structural layer by surface micromachining.

15. A tunable capacitor, as claimed in claim 1, wherein:

said first and second capacitor electrodes each comprise a plurality of grooves that are spaced in said second dimension, wherein said tuning element comprises a plurality of projections that are spaced in said second dimension, wherein each of said plurality of projections is associated with a different one of said plurality of grooves of one of said first and second capacitor electrodes.

16. A tunable capacitor, as claimed in claim 1, wherein:

said first capacitor electrode comprises a first edge, wherein said first edge of said first capacitor electrode comprises a plurality of first grooves spaced along said first edge of said first capacitor electrode;

said second capacitor electrode comprises a second edge that faces said first edge of said first capacitor electrode, wherein said second edge of said second capacitor electrode comprises a plurality of second grooves spaced along said second edge of said second capacitor electrode;

said tuning element comprises a plurality a first projections disposed along a first edge of said tuning element, wherein each said first projection is aligned in said first dimension with its own said first groove of said first capacitor electrode; and said tuning element comprises a plurality a second projections disposed along a second edge of said tuning element, wherein each said second projection is aligned in said first dimension with its own said second groove of said second capacitor electrode.

17. A tunable capacitor, as claimed in claim 1, further comprising:

means for mechanically biasing said tuning element away from said substrate and out of a space extending between said first and second capacitor electrodes.

18. A tunable capacitor, as claimed in claim 1, further comprising:

a plurality of suspension springs attached to tuning element; and a plurality of lifters acting on each of said plurality of suspension springs.

19. A tunable capacitor, as claimed in claim 1, further comprising:

a plurality of springs that suspend said tuning element above said substrate.

20. A tunable capacitor, as claimed in claim 19, wherein:

each of said plurality of springs are disposed at an elevation in said first dimension that is between said substrate and an elevation of said first and second capacitor electrodes.

21. A tunable capacitor, as claimed in claim 19, wherein:

said plurality of springs comprises a first plurality of springs and a second plurality of springs, wherein said first plurality of springs extend underneath said first capacitor electrode and are spaced in said first dimension from said first capacitor electrode, and wherein said second plurality of springs extend underneath said second capacitor electrode and are spaced in said first dimension from said second capacitor electrode.

22. A tunable capacitor, as claimed in claim 1, wherein:

said tuning element comprises first and second sides and first and second ends, wherein said tunable capacitor further comprises a first suspension spring attached to said first side, a second suspension spring attached to said second side, a third suspension spring attached to said first end, and a fourth suspension spring attached to said second end.

23. A tunable capacitor, as claimed in claim 1, further comprising:

a plurality of lifter assemblies attached to said tuning element, wherein each said lifter assembly comprises a suspension spring and a lifter, wherein said tuning element is interconnected with said suspension spring, wherein said suspension spring extends in a first direction, wherein said lifter has a length dimension that extends in a second direction that is orthogonal to said first direction, and wherein said lifter is curved in said length dimension.

24. A tunable capacitor, as claimed in claim 1, further comprising:

means for limiting a maximum separation between said tuning element and said substrate in said first dimension.

25. A tunable capacitor, as claimed in claim 1, further comprising:

a plurality of pre-stressed beams interconnected with said tuning element.

26. A tunable capacitor, as claimed in claim 25, wherein:

each of said plurality of pre-stressed beams curve in said first dimension at least when said tuning element is at a maximum disengaged position in relation to said first and second capacitor electrodes.

27. A tunable capacitor, as claimed in claim 25, further comprising:

a plurality of springs that suspend said tuning element above said substrate, wherein one end of each of said plurality of springs is attached to said tuning element and an opposite end of each of said plurality of springs is attached to at least one of said plurality of pre-stressed beams.

28. An array comprising a plurality of said tunable capacitors of claim 1.

29. An array, as claimed in claim 28, wherein:
said plurality of tunable capacitors are disposed in at least two rows.

30. An array, as claimed in claim 28, further comprising:
a first transfer function associated with said tuning element of a first of said plurality of tunable capacitors, and a second transfer function associated with said tuning element of a second of said plurality of tunable capacitors.

31. An array, as claimed in claim 1, further comprising:
a plurality of said tuning elements disposed in parallel relation, wherein each adjacent pair of said tuning elements is structurally interconnected such said plurality of said tuning elements collectively move together.

* * * * *